(12) United States Patent
Stephanou et al.

(10) Patent No.: US 9,337,799 B2
(45) Date of Patent: May 10, 2016

(54) SELECTIVE TUNING OF ACOUSTIC DEVICES

(71) Applicant: QUALCOMM MEMS Technologies, Inc., San Diego, CA (US)

(72) Inventors: Philip Jason Stephanou, Mountain View, CA (US); Chengjie Zuo, Santee, CA (US); Changhan Hobie Yun, San Diego, CA (US); Sang-June Park, San Diego, CA (US); Charles Chengyea Leu, Fremont, CA (US); Jonghae Kim, San Diego, CA (US); Ravindra V. Shenoy, Dublin, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 644 days.

(21) Appl. No.: 13/667,918

(22) Filed: Nov. 2, 2012

(65) Prior Publication Data
US 2014/0125432 A1 May 8, 2014

(51) Int. Cl.
*H03H 9/02* (2006.01)
*H03H 3/02* (2006.01)

(52) U.S. Cl.
CPC ............. *H03H 9/02149* (2013.01); *H03H 3/02* (2013.01); *H03H 2003/021* (2013.01); *H03H 2003/025* (2013.01); *H03H 2003/028* (2013.01); *Y10T 29/42* (2015.01)

(58) Field of Classification Search
CPC ............. H03H 3/02; H03H 2003/021; H03H 2003/025; H03H 2003/028; H03H 9/02149; Y10T 29/42
USPC ................ 333/133, 186, 187, 188, 193–196; 310/313 R, 313 A
See application file for complete search history.

(56) References Cited

U.S. PATENT DOCUMENTS

| | | | |
|---|---|---|---|
| 5,796,202 A | 8/1998 | Herron et al. | |
| 5,796,205 A * | 8/1998 | Nishihara et al. | 310/313 R |
| 6,391,674 B2 | 5/2002 | Ziegler | |
| 7,675,389 B2 | 3/2010 | Yamakawa et al. | |

(Continued)

OTHER PUBLICATIONS

Akiyama, et al., "Enhancement of Piezoelectric Response in Scandium Aluminum Nitride Alloy Thin Films Prepared by Dual Reactive Cosputtering," Adv. Mater. 2009, 21, pp. 593-596.

(Continued)

*Primary Examiner* — Benny Lee
*Assistant Examiner* — Jorge Salazar, Jr.
(74) *Attorney, Agent, or Firm* — Weaver Austin Villeneuve & Sampson, LLP

(57) ABSTRACT

This disclosure provides implementations of methods, apparatus and systems for producing acoustic wave devices and for selectively modifying one or more acoustic or electromechanical characteristics of such devices. In one aspect, a method includes depositing a structural layer over a substrate. The structural layer includes a plurality of structural portions, each being positioned over a corresponding device region. The method also includes arranging a mask layer over the structural layer. The mask layer includes a plurality of mask portions, each including a number of mask openings that expose a corresponding region of the structural portion. The method also includes accelerating dopant particles toward the mask layer. The accelerated dopant particles that proceed through the mask openings are impacted into the corresponding structural portion. The impacted dopant particles modify material properties in the structural portion, which then effect a change in the acoustic or electromechanical characteristics of the acoustic wave device.

14 Claims, 14 Drawing Sheets

(56) References Cited

U.S. PATENT DOCUMENTS

| | | | |
|---|---|---|---|
| 7,836,574 | B2 | 11/2010 | Jafri et al. |
| 7,982,558 | B2 | 7/2011 | Sworowski et al. |
| 2010/0127596 | A1 | 5/2010 | Ayazi et al. |
| 2011/0147762 | A1 | 6/2011 | Sheppard |

OTHER PUBLICATIONS

Huang, et al., "A Novel Approach to Integrate Multiple Film Bulk Acoustic Resonators (FBAR) with Different Frequencies in a Single Chip," NSTI-Nanotech 2005, www.nsti.org, ISBN 0-9767985-2-2, vol. 3, pp. 435-438.

Tasnadi, et al., "Origin of the Anomalous Piezoelectric Response in Wurtzite $Sc_xAl_{1-x}N$ Alloys," Physical Review Letters, 104, 137601, 2010, 4 pages.

Wang, et al., "Method of Fabricating Multiple-Frequency Film Bulk Acoustic Resonators in a Single Chip," 2006 IEEE International Frequency Control Symposium and Exposition, pp. 793-796.

* cited by examiner

SELECTIVE TUNING OF ACOUSTIC DEVICES

TECHNICAL FIELD

This disclosure relates generally to signal processing, and more specifically to methods and systems for producing acoustic wave devices and for selectively tuning or otherwise modifying one or more acoustic or electromechanical characteristics of such devices.

DESCRIPTION OF THE RELATED TECHNOLOGY

Electromechanical systems (EMS) include devices having electrical and mechanical elements, transducers such as actuators and sensors, optical components (including mirrors), and electronics. EMS can be manufactured at a variety of scales including, but not limited to, microscales and nanoscales. For example, microelectromechanical systems (MEMS) devices can include structures having sizes ranging from about one micron to hundreds of microns or more. Nanoelectromechanical systems (NEMS) devices can include structures having sizes smaller than one micron including, for example, sizes smaller than several hundred nanometers. Electromechanical elements may be created using deposition, etching, lithography, or other micromachining processes that etch away parts of substrates or deposited material layers, or that add layers to form electrical, mechanical, and electromechanical devices.

Elastic (or acoustic) wave devices are utilized in a variety of applications including frequency control applications. For example, acoustic wave devices can be utilized in transmitters, receivers, transceivers, filters, clock oscillators, delay lines, delay line oscillators, among other example applications. In some implementations, the acoustic wave devices are acoustic wave resonating devices or "resonators" having one or more resonant frequencies. In many implementations of such acoustic wave devices (also known as electromechanical acoustic wave devices), electrical energy is transduced into mechanical energy (such as vibrations or elastics waves), and vice versa.

Acoustic wave resonators and other acoustic wave devices also are typical in filtering applications. Frequency bandpass filters, for example, are utilized in radio architectures employed by wireless devices such as consumer mobile handsets. Contemporary handsets may operate across multiple communication standards and multiple frequency bands. These demands have necessitated the integration of multiple discrete filters within the radio-frequency front-end module (RF-FEM) of such handsets or other wireless devices. In order to meet the requisite performance specifications, these filters have been synthesized from electromechanical device "building blocks" such as surface acoustic wave (SAW) devices, film bulk acoustic wave resonators (FBAR), and bulk acoustic wave (BAW) resonators. Traditional SAW, FBAR, and BAW devices are inherently discrete devices. As the number of bands being utilized increases, integrating the increasing number of required discrete filter components and other components into a single system-in-package (SiP) becomes an increasingly problematic endeavor in terms of module cost and size, as well as system design and supply chain management complexity.

Other examples of conceptual solutions have been proposed to enable higher levels of multi-frequency integration including: contour mode resonators (CMR) having operating frequencies that are substantially determined by lithographically-defined in-plane dimensions; multi-structural layer FBAR implementations involving shadow masking or buried etch stop layers; and FBAR-like structures topped with lithographically-defined "tuning patterns."

SUMMARY

The structures, devices, apparatus, systems, and processes of the disclosure each have several innovative aspects, no single one of which is solely responsible for the desirable attributes disclosed herein.

The disclosed implementations include examples of methods, processes, techniques, apparatus and systems for producing acoustic wave devices and for selectively tuning or otherwise modifying one or more acoustic or electromechanical characteristics of such devices. According to one innovative aspect of the subject matter described in this disclosure, a method includes depositing a structural layer over a substrate. The structural layer includes a plurality of structural portions, each structural portion being positioned over a corresponding device region for use in forming a corresponding acoustic wave device in the device region. The method also includes arranging a mask layer over the structural layer. The mask layer includes a plurality of mask portions, each mask portion including a number of mask openings, each mask opening exposing a corresponding region of the structural portion below the mask portion. The method also includes accelerating dopant particles toward the mask layer. The accelerated dopant particles that proceed through the mask openings in the corresponding mask portion of the acoustic wave device are impacted into the corresponding structural portion. The impacted dopant particles modify one or more material properties in the structural portion. The modified material properties effect a change in one or more acoustic or electromechanical characteristics of the acoustic wave device.

In some implementations, a ratio of the surface area of the structural portion exposed by the number of mask openings in the corresponding mask portion to the surface area of the structural portion not exposed by mask openings in the corresponding mask portion approximately governs a resultant dopant concentration in the structural portion. In some such implementations, the modification to the one or more material properties in the structural portion and the effected changes in the one or more acoustic or electromechanical characteristics of the acoustic wave device depend on the dopant concentration.

In some such implementations, the mask portions include mask portions of a first type and mask portions of a second type. In some such implementations, each mask portion of the first type has the same number and layout of mask openings as the other mask portions of the first type, while each mask portion of the second type has the same number and layout of mask openings as the other mask portions of the second type. The ratio for each mask portion of the first type is a first ratio while the ratio for each mask portion of the second type is a second ratio different than the first ratio. As a result, the dopant concentration in each mask portion of the first type is a first dopant concentration and the dopant concentration in each mask portion of the second type is a second dopant concentration different from the first dopant concentration.

In some such implementations, the mask openings in each mask portion of the first type have substantially the same shape and size as the mask openings in each mask portion of the second type and the number of mask openings in each mask portion of the first type is different than the number of mask openings in each mask portion of the second type. In some other implementations, the number of mask openings in each mask portion of the first type is the same as the number of mask openings in each mask portion of the second type and the mask openings in each mask portion of the first type have different shapes or sizes than the mask openings in each mask portion of the second type.

In some implementations, the method further includes removing the mask layer and removing other portions of the structural layer to acoustically isolate the structural portions. In some implementations, the method further includes depositing and patterning an upper conductive layer over the structural layer to form a plurality of sets of upper electrodes. Each set of upper electrodes can include one or more upper electrodes. Each set of upper electrodes is positioned over a corresponding structural portion and is suitable for use in forming the corresponding acoustic wave device. In some implementations, the method further includes depositing and patterning a lower conductive layer over the substrate to form a plurality of sets of lower electrodes. Each set of lower electrodes includes one or more lower electrodes. Each set of lower electrodes is suitable for use in forming the corresponding acoustic wave device.

In some implementations, a frequency response of each of the resultant acoustic wave devices is a function of the dopant concentration in the device. In some implementations, a resonant frequency of each of the resultant acoustic wave devices is a function of the dopant concentration in the device. In some implementations, an electromechanical coupling coefficient of each of the resultant acoustic wave devices is a function of the dopant concentration in the device. In some implementations, a fractional bandwidth of each of the resultant acoustic wave devices is a function of the dopant concentration in the device.

In some implementations, the dopant particles impacted into a given structural portion effect a change in a ratio of an elastic stiffness to a mass density of the structural portion. In some implementations, the dopant particles impacted into a given structural portion effect a change in a ratio of a piezoelectric coefficient to the product of a dielectric permittivity and an elastic stiffness of the structural portion. In some implementations, the dopant particles include one or more of Scandium (Sc) ions, Erbium ions (Er), Chromium (Cr) ions, or another type or types of ions. In some implementations, the structural layer is formed of at least one of a piezoelectric material and a semiconductor material. In some implementations, accelerating the dopant particles toward the mask layer includes accelerating the dopant particles toward substantially the entire mask layer at substantially the same time and for substantially the same duration. In some implementations, accelerating the dopant particles includes using one or more ion implantation techniques to accelerate and impact the dopant particles.

According to one innovative aspect of the subject matter described in this disclosure, a device includes an array of acoustic wave devices. The array of acoustic wave devices including a plurality of sets of acoustic wave devices. Each set of acoustic wave devices includes one or more acoustic wave devices. Each acoustic wave device includes a structural portion. A thickness of the structural portion of each acoustic wave device is substantially equal to the thicknesses of the structural portions of all the other acoustic wave devices in the array of acoustic wave devices. A dopant particle concentration in the structural portion of each acoustic wave device in each set of acoustic wave devices is substantially the same dopant concentration in the other acoustic wave devices of the set and different than the dopant concentration in the other acoustic wave devices of all the other sets in the array of acoustic wave devices. The dopant concentration in each structural portion modifies one or more material properties as a function of the dopant concentration in the structural portion to effect one or more changes in one or more acoustic or electromechanical characteristics of the acoustic wave device.

In some implementations, the acoustic characteristics include one or more of a frequency response, a resonant frequency, an electromechanical coupling coefficient, and a fractional bandwidth of the acoustic wave resonating device. In some implementations, the dopant particles are impacted into the structural portions of all of the acoustic wave devices of the array substantially simultaneously. In some implementations, the dopant concentration in a given structural portion effects a change in a ratio of an elastic stiffness to a mass density of the structural portion. In some implementations, the dopant concentration in a given structural portion effects a change in a ratio of a piezoelectric coefficient to the product of a dielectric permittivity and an elastic stiffness of the structural portion. In some implementations, the dopant particles include one or more of Scandium (Sc) ions, Erbium ions (Er), Chromium (Cr) ions. In some implementations, each structural portion is formed of a piezoelectric material.

Details of one or more implementations of the subject matter described in this specification are set forth in the accompanying drawings and the description below. Although some of the examples provided in this disclosure may be described in terms of EMS and MEMS-based displays, the concepts provided herein may apply to other types of displays, such as liquid crystal displays (LCDs), organic light-emitting diode (OLED) displays and field emission displays. Other features, aspects, and advantages will become apparent from the description, the drawings, and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1:
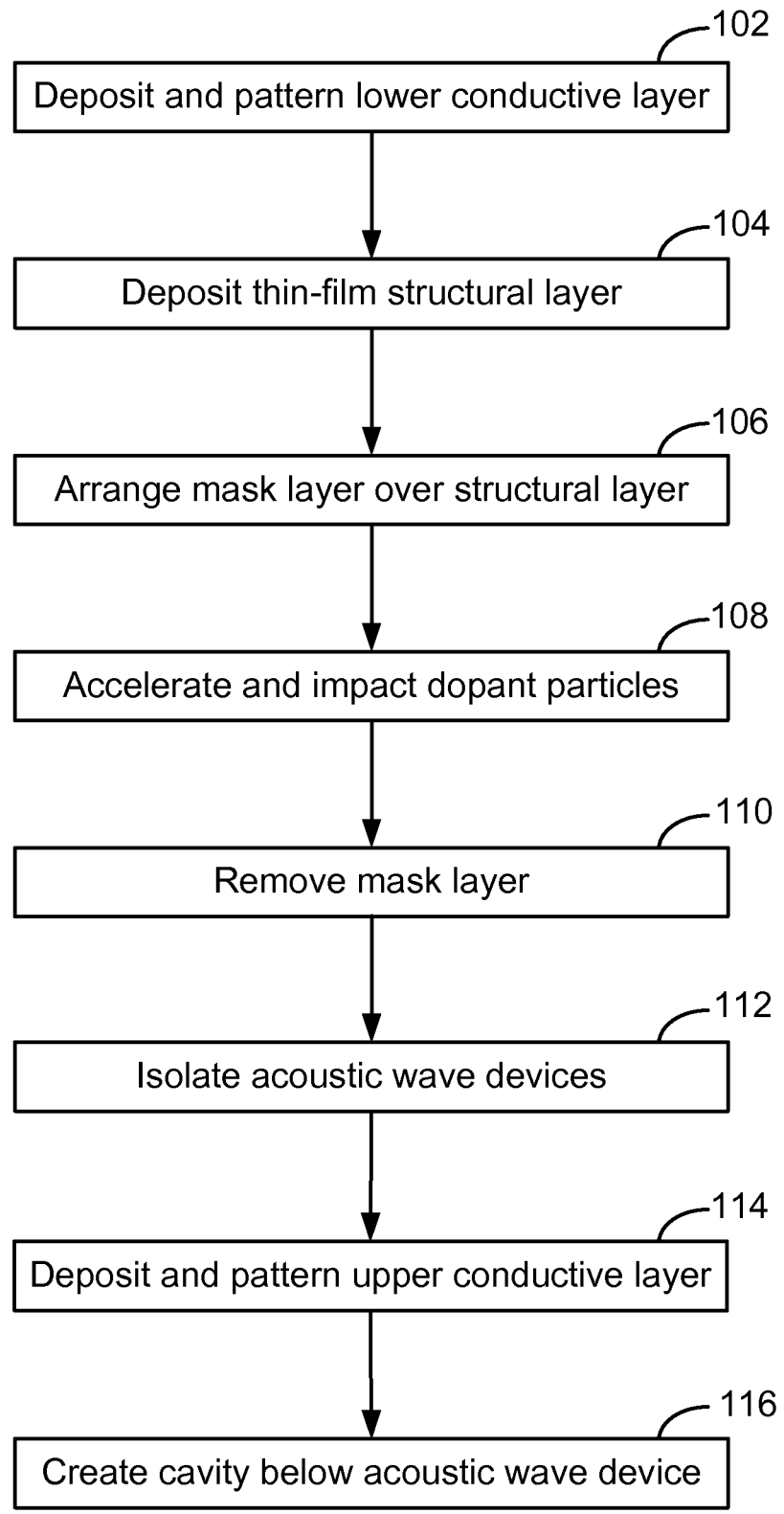
FIG. 1 shows an example of a flow diagram illustrating a process for forming an array of acoustic wave devices.

The description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (such as e-readers), computer monitors, automotive displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

The disclosed implementations include examples of methods, processes, techniques, apparatus and systems for producing acoustic wave devices and for selectively tuning or otherwise modifying one or more acoustic or electromechanical characteristics of such devices. Some implementations utilize ion implantation or other "doping" techniques to selectively vary the material properties of a structural layer in selected ones or sets of the acoustic wave devices of an array of acoustic wave devices. By varying the material properties, one or more acoustic or electromechanical characteristics of the selected acoustic wave devices can be tuned. In some implementations, the dopant concentration is used to selectively change a ratio of the effective elastic modulus or of one or more elastic coefficients of a structural device layer, or a portion thereof, to the effective mass density of the structural device layer, or the portion thereof. In some implementations in which the structural device layer is a piezoelectric layer, the dopant concentration additionally or alternatively can be used to selectively change a ratio of one or more effective piezoelectric coefficients of the piezoelectric structural device layer, or a portion thereof, to the product of the dielectric permittivity and one or more effective stiffness coefficients of the piezoelectric structural device layer, or the portion thereof. In some implementations, the desired lateral spatial distribution of the dopant concentration is achieved by selectively masking regions of the target structural device layer using a technique such as photolithography. The distribution across the thickness of the device can vary according to the properties of the ions used in the doping, the material properties of the structural layer, the energy imparted to the ions used in the doping. Techniques such as post-deposition annealing can be used to vary the distribution across the thickness. For example, post-deposition annealing can be used to force migration of some of the ions downwards from the upper surface of the structural layer.

Particular implementations of the subject matter described in this disclosure can be implemented to realize one or more of the following potential advantages. Some advantageous implementations enable batch- or substrate-level fabrication of multiple elastic (or "acoustic") wave devices with independently or otherwise selectively-prescribed acoustic or electromechanical characteristics on a single substrate. For example, in some implementations one or more acoustic or electromechanical characteristics of each acoustic wave device can be prescribed or tuned during fabrication of the device by selectively adjusting a dopant concentration in a structural layer of the device. For example, the acoustic or electromechanical characteristics that can be changed in some implementations include one or more of a resonant frequency, a frequency response, a fractional bandwidth, and an electromechanical coupling coefficient, among others. Generally, many implementations enable significant improvements in component count reduction and opportunities for integration. In some implementations, the resultant acoustic wave devices can be utilized in transmitters, receivers, transceivers, filters, clock oscillators, delay lines, or delay line oscillators, among other example applications.

In some implementations, the acoustic wave devices are acoustic wave resonating devices or "resonators" having one or more resonant frequencies. Some implementations described in this disclosure can generally apply to a range of devices including membrane type resonators and solidly-mounted resonator (SMR) types. For example, various implementations can be applicable to piezoelectric film bulk acoustic wave resonators (FBARs), piezoelectric bulk acoustic wave (BAW) resonators, piezoelectric contour mode resonators (CMRs), piezoelectric higher-order CMRs (such as with patterned top and/or bottom electrodes), electrostatic CMRs, and piezoelectric surface acoustic wave (SAW) devices.

Some implementations enable co-fabrication of an array of acoustic wave filters—each incorporating one or more acoustic wave devices described herein—on the same substrate that address multiple independent frequencies but that share the same uniform height. In implementations in which the acoustic wave devices are acoustic resonators, such as acoustic MEMS resonators, the doping techniques can be utilized to selectively vary the material properties of selected devices to tune the resonant frequencies or fractional bandwidths of the devices. For example, relatively substantial changes in the material properties as a result of relatively higher doping can result in large magnitude frequency changes that move the center frequency of the resonator and resultant filter from one frequency band to another desired frequency band. Similarly, relatively substantial changes in the material properties as a result of relatively higher doping can result in large magnitude electromechanical coupling coefficient changes that change the fractional bandwidth of the resonator and resultant filter from one passband width to another desired passband width. Less substantial material changes in the material properties as a result of relatively lower doping can be used to introduce smaller magnitude frequency shifts or changes in the fractional bandwidth that fine-tune or trim the operating frequency characteristics of a given resonator.

In some implementations, electrical energy is transduced into mechanical energy (such as vibrations or elastics waves), and vice versa. Such acoustic wave devices may be called electromechanical acoustic wave devices. In some such implementations, the electromechanical transduction mechanism can be piezoelectric. In other such implementations, the electromechanical transduction mechanism can be electrostatic (such as electrostatically-transduced silicon (Si)). Examples of other transduction mechanisms that can be used in some other implementations include electromagnetic, photoelectric and thermoelectric, among others. Some implementations may utilize two or more of the aforementioned transduction mechanisms.

The acoustic or other electromechanical characteristics of acoustic wave devices also can be determined by device dimensions as well as the material properties. For example, the natural resonant frequencies of acoustic wave resonators are determined by both the material properties of their constituent layers as well as one or more characteristic geometrical dimensions. For example, the material properties generally have a greater contribution in determining the propagation velocity of the elastic ("acoustic") waves through the piezoelectric material or other structural material in which transduction or propagation occurs. The characteristic geometrical dimension, on the other hand, generally has a greater contribution in determining at what wavelengths the waves can form standing wave patterns in the piezoelectric material layer or other structural material layer (the wavelengths that correspond to the "resonant frequencies" of the devices). Some example implementations produce or utilize so-called "thickness mode" devices; that is, acoustic wave resonating devices in which the characteristic geometrical dimension is effectively the thickness of a thin-film structural layer. For example, an FBAR is such a device.

Figure 2A:
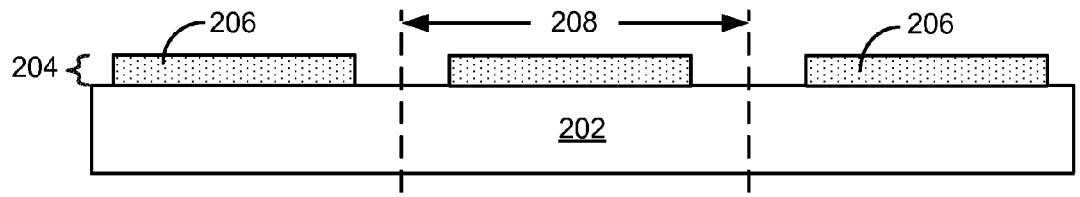
FIGS. 2A, 2B, 2C, 2E, 2F, 2G and 2H show cross-sectional schematic depictions of example stages in a process as, for example, described with reference to FIG. 1.

FIG. 1 shows an example of a flow diagram illustrating a process for forming an array of acoustic wave devices. For example, the process 100 of FIG. 1 can be used to form an array of membrane-type acoustic wave resonating devices such as, for example, FBARs, CMRs, or dilation mode resonators (DMRs). FIGS. 2A-2H show cross-sectional schematic depictions of example stages in a process as, for example, described with reference to FIG. 1. In some implementations, the process 100 begins in block 102 with depositing and patterning a lower conductive layer 204 over a substrate 202 to form a plurality of sets of lower electrodes 206, as FIG. 2A shows. In some implementations, the substrate 202 can be formed of a dielectric or semiconducting material. In some implementations, the substrate 202 can be a plate or a wafer, such as a Si wafer.

Each set of lower electrodes 206 includes one or more lower electrodes suitable for use in forming a corresponding acoustic wave device in a device region 208 of the substrate 202. The lower conductive layer 204 and the upper conductive layer (described below) may be made of various conductive metals, alloys, and other materials including platinum (Pt), aluminum (Al), molybdenum (Mo), tungsten (W), titanium (Ti), niobium (Nb), ruthenium (Ru), chromium (Cr), doped polycrystalline silicon, doped aluminum gallium arsenide (AlGaAs) compounds, gold (Au), copper (Cu), silver (Ag), tantalum (Ta), cobalt (Co), nickel (Ni), palladium (Pd), silicon germanium (SiGe), doped conductive zinc oxide (ZnO), and combinations thereof. In various implementations, the lower electrodes 206 and/or the upper electrodes 238 (described below) can include the same conductive material(s) or different conductive materials. In some implementations, one or more first layers are deposited before the lower conductive layer. For example, one or more seed layers (such as AlN) can be deposited prior to depositing the lower conductive layer 204 or the upper conductive layer described below. In some implementations, the lower conductive layer 204 and upper conductive layer can be deposited by any suitable technique including, for example, sputtering. In one particular example implementation, each resultant lower electrode 206 is formed of Mo and has a thickness of approximately 1200 angstroms (Å).

Additionally, while only three device regions 208 are shown in FIGS. 2A-2H, in other implementations, the substrate 202 can include arrays of tens, hundreds, thousands, or more, of the device regions 208 enabling the production of as many acoustic wave devices on the substrate 202.

Figure 2B:
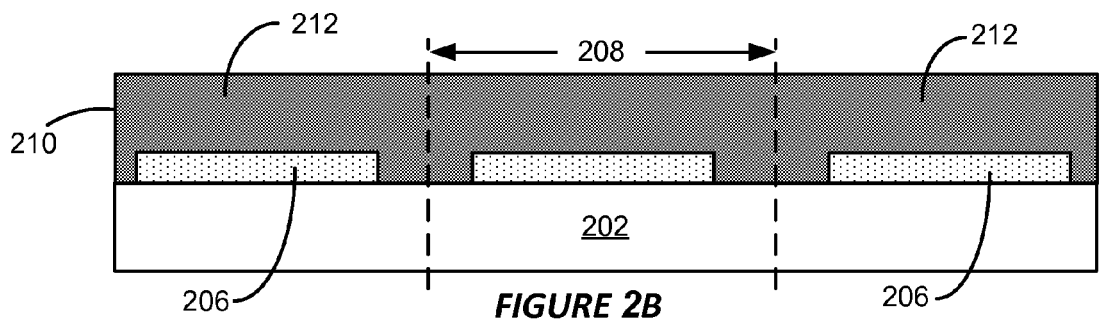

In some implementations, the process 100 proceeds in block 104 with depositing a thin-film structural device layer ("structural layer") 210 over the lower conductive layer 204, as FIG. 2B shows. The structural layer 210 includes a plurality of structural portions 212 that each correspond in footprint with a corresponding device region 208. Each structural portion 212 of the structural layer 210 is positioned over a corresponding set of the lower electrodes 206 in a device region 208. As described above, in some implementations, the structural layer 210 is formed from a piezoelectric material. The piezoelectric materials that can be used in fabrication of the structural layer 210 include, for example, aluminum nitride (AlN), zinc oxide (ZnO), gallium arsenide (GaAs), aluminum gallium arsenide (AlGaAs), gallium nitride (GaN), quartz, zinc-sulfide (ZnS), cadmium-sulfide (CdS), lithium tantalite (LiTaO3), lithium niobate (LiNbO3), lead zirconate titanate (PZT), members of the lead lanthanum zirconate titanate (PLZT) family, doped aluminum nitride, and combinations thereof. In some implementations, the structural layer 210 can be sputtered or otherwise deposited to a thickness in the range of, for example, approximately 0.5 µm to approximately 4 µm.

Figure 2C:
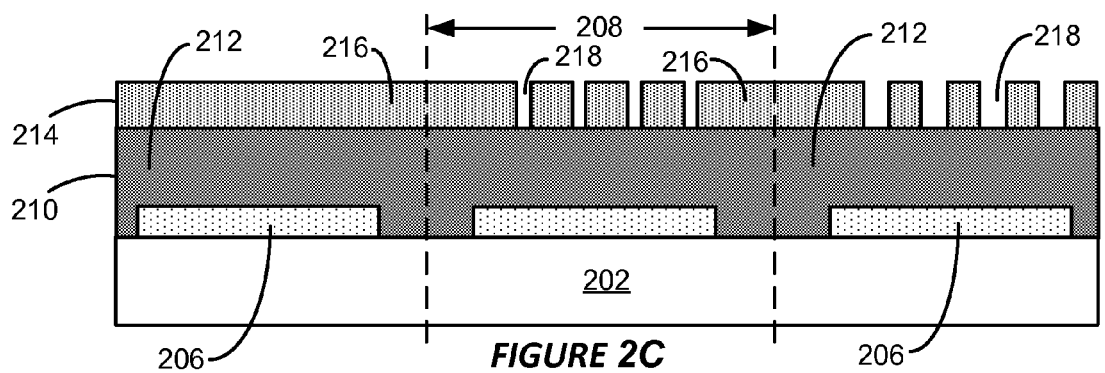

In some implementations, a mask layer 214 is then arranged in block 106 over the structural layer 210, as FIG. 2C shows. The mask layer 214 includes a plurality of mask portions 216. Each mask portion 216 includes a number of mask openings 218 that expose corresponding underlying regions of the structural portion 212 below the mask portion 216. In some implementations, the mask layer 214 is deposited by spin coating a suitable material over the structural layer 210. For example, the mask layer 214 can be formed by spin coating a photoresist layer over the structural layer 210 and subsequently patterning the photoresist layer using photolithography and etching or other removal operations to produce the mask openings 218. In some other implementations, the mask layer 214 can be a shadow mask, a laminated polymer layer with laser-patterned mask openings 218, or a deposited thin film layer with wet- or dry-etched mask openings 218.

In some implementations, the mask layer 214 can have any suitable thickness for substantially preventing the dopant particles described below from penetrating and proceeding entirely through the mask layer 214 to the structural layer 210 below. In this way, for example, no dopant particles reach the structural portions 212 that do not proceed through one of the mask openings 218. For example, in some implementations, the mask layer has a thickness in the range of approximately 0.5 μm to 3 μm.

Figure 3:
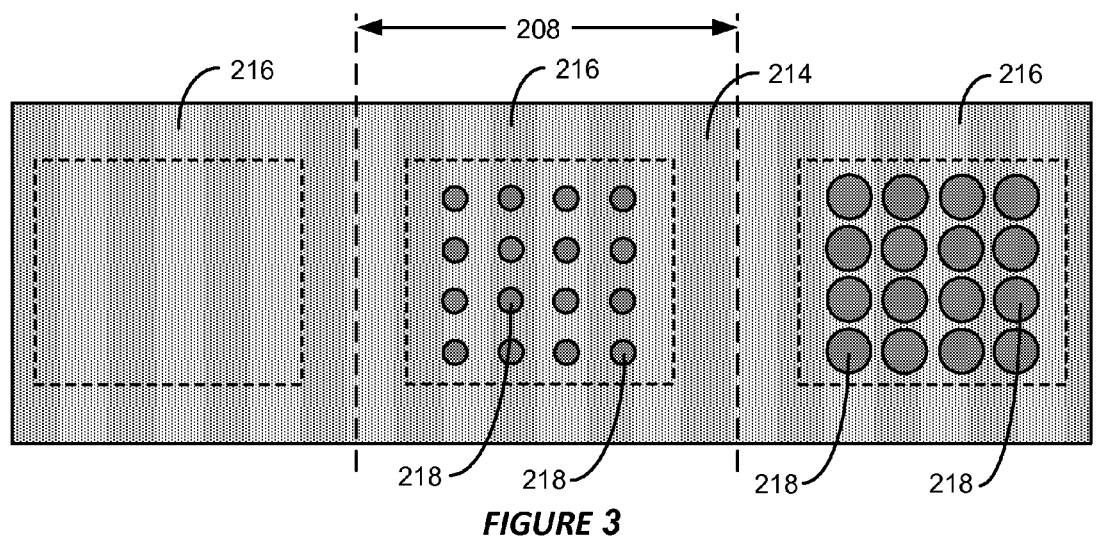
FIG. 3 shows a top view of the arrangement shown in FIG. 2C.

FIG. 3 shows a top view of the arrangement shown in FIG. 2C. As the implementation of FIG. 3 shows, the number and arrangement of the mask openings in the middle and rightmost mask portions 216 are the same: it is the size of the mask opening 218 that differs. In some other implementations, the sizes of the mask openings between different mask portions 216 or even within a given mask portion may differ, as described below. Additionally, although the mask openings 218 are depicted as an array or grid of circles, in other implementations, the mask openings 218 can be elliptical, rectangular, in the shape of another polygon, or take the form of an array of parallel channels or two arrays of intersecting channels. In some other implementations, the number and density of the mask openings 218 also can be changed to achieve more exposure of the underlying structural portion 212 while not changing the size of the mask openings 218.

Figure 2D:
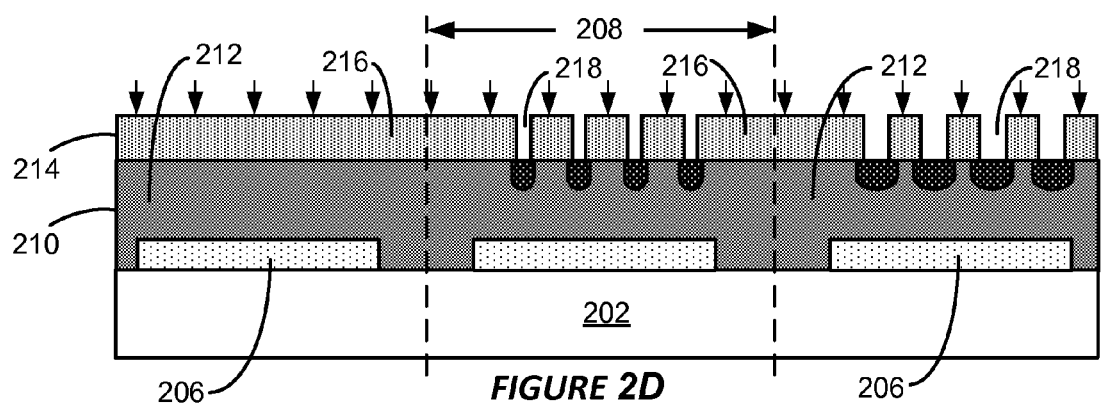

In some implementations, the process 100 proceeds in block 108 with accelerating dopant particles toward the mask layer 214, as FIG. 2D shows. For each acoustic wave device formed or to be formed in a region 208, the accelerated dopant particles that proceed through the mask openings 218 in the corresponding mask portion 216 of the acoustic wave device are impacted into the corresponding structural portion 212 of the acoustic wave device. The impacted dopant particles modify one or more material properties in the structural portion 212. The modified material properties, in turn, effect a change in one or more acoustic or electromechanical characteristics of the resultant acoustic wave device in each particular device region 208.

In some implementations, one or more ion implantation techniques are used to accelerate and impact the dopant particles. In this way, in some implementations, the dopant particles can be accelerated toward substantially the entire mask layer at substantially the same time and for substantially the same duration. However, despite the equal or substantially equal duration of the doping over each device region 208, a multitude of differently behaving acoustic devices can be formed because of the variety in the selection and arrangement of the mask portions 216 and corresponding mask openings 218. Additionally, in some implementations, a post-implantation thermal anneal process may be used to promote dopant diffusion through the structural portions 212 and to heal any damage to or defects in the crystal structure of the doped structural portions 212.

In some implementations, a ratio of the surface area of the structural portion 212 exposed by the mask openings 218 in the corresponding mask portion 216 to the surface area of the structural portion 212 not exposed by the mask openings 218 in the corresponding mask portion 216 approximately governs a resultant dopant concentration in the structural portion 212. In some implementations, the modification to the one or more material properties in the structural portion 212 and the effected changes in the one or more acoustic or electromechanical characteristics of the resultant acoustic wave device 240 depend on the dopant concentration.

As described above, the mask portions 216 of a given mask layer 214 can advantageously include mask portions of a plurality of types or sets. In some such implementations, the mask portions 216 can include mask portions of a first type (such as in the rightmost device region 208 in FIGS. 2A-2H), mask portions of a second type (such as in the middle device region 208 in FIGS. 2A-2H), and mask portions of a third type (such as in the leftmost device region 208 in FIGS. 2A-2H). In some such implementations, each mask portion 216 of the first type has the same number and layout of mask openings 218 as the other mask portions 216 of the first type. Similarly, each mask portion 216 of the second type has the same number and layout of mask openings 218 as the other mask portions 216 of the second type. In the illustrated implementation, the mask portions 216 of the third type don't have any mask openings 218. In some other implementations, the mask portions 216 of the third type can have a different number and arrangement of mask openings 218. In some other implementations, there also can be mask portions of additional different types beyond the first, second and third types.

As described, the resultant acoustic devices produced using the mask portions 216 of the first type will have a first ratio of exposed to not-exposed surface area resulting in a first dopant concentration in the structural portions 212 of devices using the mask portions 216 of the first type. Similarly, the resultant acoustic devices produced using the mask portions 216 of the second type will have a second different ratio of exposed to not-exposed surface area resulting in a second dopant concentration in the structural portions 212 of devices using the mask portions 216 of the second type. For example, as FIG. 2D shows, the dopant implantation and masking result in a dopant concentration that is highest in the structural portion 212 of the rightmost device region 208 where, because of the design of the mask portion 216 of the first type, there was more exposure by the mask openings 218.

In some implementations, as in FIG. 3, the number of mask openings 218 in each mask portion of the first type is the same as the number of mask openings in each mask portion of the second type, but the mask openings 218 in each mask portion 216 of the first type have larger size than the mask openings 218 in each mask portion 216 of the second type. In some other such implementations, the mask openings 218 in the mask portions 216 of the first type could have a different shape or layout than the mask openings 218 in the mask portions 216 of the second type. In some other implementations, the mask openings 218 in each mask portion 216 of the first type have substantially the same shape and size as the mask openings in each mask portion 216 of the second type, but the number, and hence the density, of mask openings 218 in each mask portion 216 of the first type is greater than the number of mask openings 218 in each mask portion 216 of the second type.

In some implementations, the acoustic characteristics modified by the dopant concentrations in the resultant acoustic devices include the frequency response of the resultant acoustic device. Thus, the resultant acoustic devices 240 produced using the mask portions 216 of the first type would have a first frequency response while the resultant acoustic devices 240 produced using mask portions 216 of the second and third types would have second and third frequency responses, respectively, that all differ in at least one way from one another. As described above, in some implementations, each of the resultant acoustic wave devices 240 is an acoustic wave resonating device. In some such implementations, the resultant acoustic resonators produced using the mask portions 216 of the first type would have a first resonant frequency while the resultant acoustic resonators produced using the mask portions 216 of the second and third types would have second and third resonant frequencies, respectively, that all differ from one another.

As described above, in some implementations, the change or changes in one or more acoustic or electromechanical characteristics of the resultant acoustic devices 240 are functions of changes in one or more material properties of the structural portion 212, such as changes in one or more of the effective elastic coefficients or in the effective mass density of the structural portion 212. In some particular implementations, the change or changes in one or more acoustic or electromechanical characteristics are functions of the ratio of the elastic stiffness to the mass density of the structural portion 212. For example, a resonance $f_n$ of a resultant acoustic resonator device can be:

$$f_n \propto \sqrt{\frac{E}{\rho}}$$

where $\propto$ indicates proportionality, E is the elastic modulus of the structural device layer 210, and $\rho$ is the mass density of the structural layer 210. Additionally or alternatively, in some other implementations, other material properties can be changed by the introduction of the dopant particles. In some implementations, one or more of the elastic coefficients, stiffness coefficients, mass density, dielectric permittivity, piezoelectric coefficients, temperature coefficients of expansion, and temperature coefficients of stiffness can change with the doping. Such material properties can be selectively changed by the selective use of doping concentrations, bombardment intensity, and choice of doping ions. In some implementations, the effect of the doping in the modification of the one or more material properties can increase as the thickness of the structural layer 210 decreases: for example, because the doping ions penetrate relatively deeper into the structural portions 212 and thus may achieve a more uniform doping profile across the thickness of each structural portion 212.

In some implementations, depending on the dopant particles used and the materials used to form the structural layer 210, the impacted dopant particles decrease the elastic stiffness and increase the mass density of the structural portion 212. In some other implementations, the impacted dopant particles increase the elastic stiffness and decrease the mass density of the structural portion 212. In some other implementations, the impacted dopant particles increase the elastic stiffness and increase the mass density of the structural portion 212. In some other implementations, the impacted dopant particles decrease the elastic stiffness and decrease the mass density of the structural portion 212. As described above, in some implementations, the change or changes in one or more acoustic or electromechanical properties are functions of the ratio of the elastic stiffness to the mass density of the structural portion 212. Thus, while both the elastic stiffness and the mass density may change in the same direction (such as both increase or both decrease), the ratio can still change with doping depending on the relative increases or relative decreases in the elastic stiffness and the mass density. For example, in some implementations, the impacted dopant particles increase the elastic stiffness by a greater proportion than they increase the mass density of the structural portion. In some other implementations, the impacted dopant particles decrease the elastic stiffness by a greater proportion than they decrease the mass density of the structural portion. In some implementations, the impacted dopant particles increase the elastic stiffness by a smaller proportion than they increase the mass density of the structural portion. In some other implementations, the impacted dopant particles decrease the elastic stiffness by a smaller proportion than they decrease the mass density of the structural portion.

The acoustic or electromechanical characteristics that can be modified by the dopant concentrations in the resultant acoustic devices 240 include the electromechanical coupling coefficient $k_t^2$ of the resultant acoustic device 240. Thus, the resultant acoustic devices 240 produced using the mask portions 216 of the first type would have a first electromechanical coupling coefficient while the resultant acoustic devices 240 produced using the mask portions 216 of the second and third types would have second and third electromechanical coupling coefficients, respectively, that all differ in at least one way from one another.

In some implementations, a change in the electromechanical coupling coefficient $k_t^2$, or a change one or more other acoustic or electromechanical characteristics of the resultant acoustic devices 240, is a function of a change in one or more of the following material properties: the elastic stiffness of the structural portion 212, the dielectric permittivity of the structural portion 212, or one or more piezoelectric coefficients of the structural portion 212. In some particular implementations, the change or changes in one or more acoustic or electromechanical properties are functions of the ratio of the piezoelectric coefficient to the product of the dielectric permittivity and the elastic stiffness of the structural portion 212. For example, the electromechanical coupling coefficient $k_t^2$ of a resultant acoustic resonator device 240 can be:

$$k_t^2 \propto \frac{e_{3i}^2}{\varepsilon E}$$

where $\propto$ indicates proportionality, E is the elastic modulus of the structural device layer 210, $e_{3i}$, is a piezoelectric coefficient of the structural layer 210, and $\in$ is the dielectric permittivity of the structural layer 210. In some other implementations, other material properties can be changed by the introduction of the dopant particles. Again, in some implementations, the effect of the doping in the modification of the one or more material properties can increase as the thickness of the structural layer 210 decreases.

In some implementations, depending on the dopant particles used and the materials used to form the structural layer 210, the impacted dopant particles may decrease or increase each of one or more of the elastic stiffness, the dielectric permittivity, and a piezoelectric coefficient of the structural portion 212. As described above, in some implementations, the dopant particles impacted into a given structural portion 212 effect a change in a ratio of a piezoelectric coefficient to the product of the dielectric permittivity and the elastic stiffness of the piezoelectric structural portion. In some such implementations, the impacted dopant particles reduce the ratio of a piezoelectric coefficient to the product of the dielectric permittivity and the elastic stiffness of the piezoelectric structural portion thereby reducing the electromechanical coupling coefficient $k_t^2$ of the structural portion 212. In some other implementations, the impacted dopant particles increase the ratio of a piezoelectric coefficient to the product of the dielectric permittivity and the elastic stiffness of the piezoelectric structural portion thereby increasing the electromechanical coupling coefficient $k_t^2$ of the structural portion 212.

In some implementations, each structural portion 212 has substantially the same structure before and after the impaction of the dopant particles; that is, the crystal structure remains on the whole effectively unchanged. In one specific example, the structural layer has a substantially Wurtzite crystal structure before and after the impaction of the dopant particles. But other implementations described herein are not limited to acoustic wave devices in which the structural portions of the devices have Wurtzite crystal structures. Generally, various implementations can be used in conjunction with structural portions 212 having a variety of crystal structures.

Figure 4:
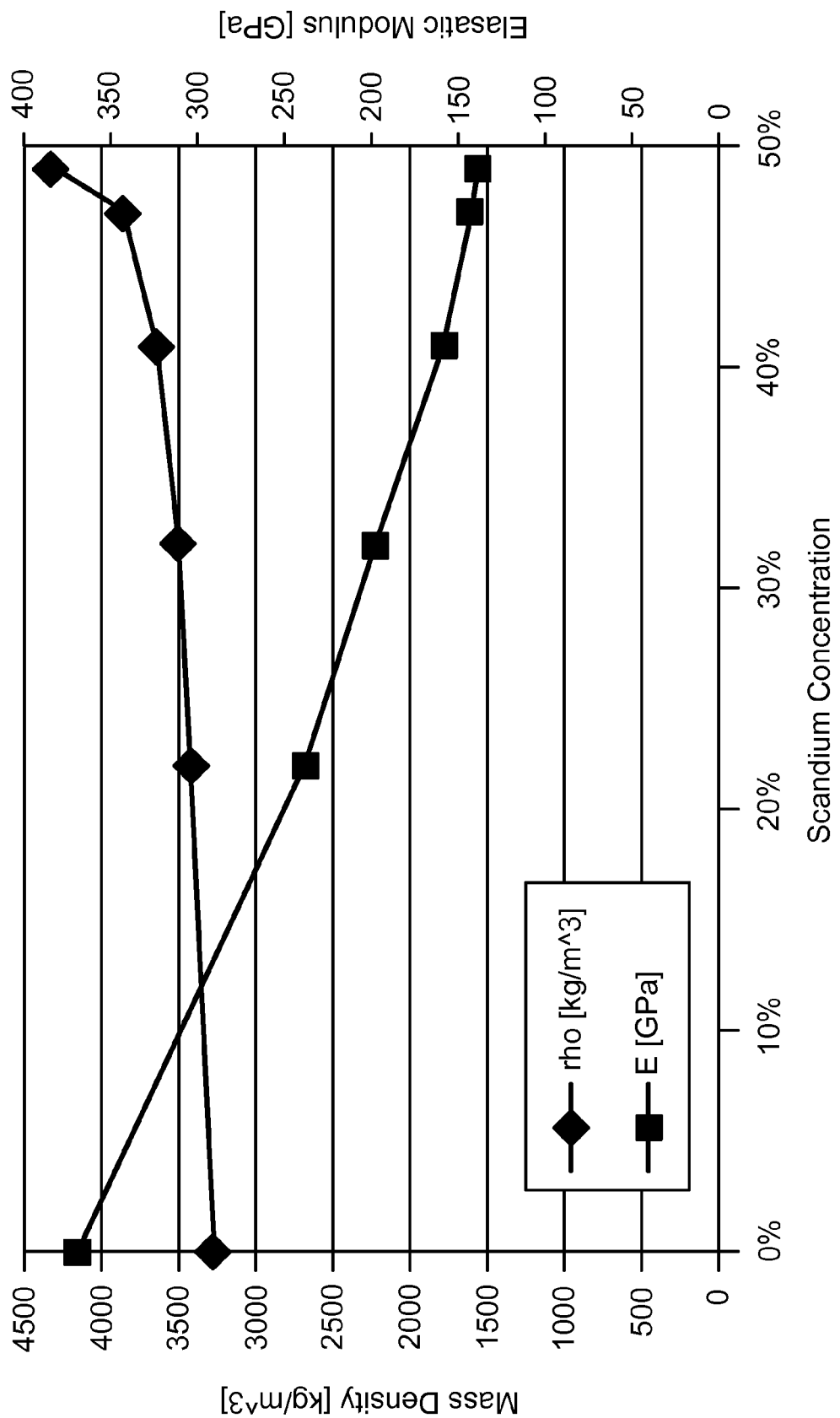
FIG. 4 shows a plot depicting example representative relationships between the elastic modulus and the scandium (Sc) dopant concentration in an aluminum nitride (AlN) thin-film piezoelectric layer and between the mass density and the Sc dopant concentration in the AlN thin-film piezoelectric layer.
Figure 5:
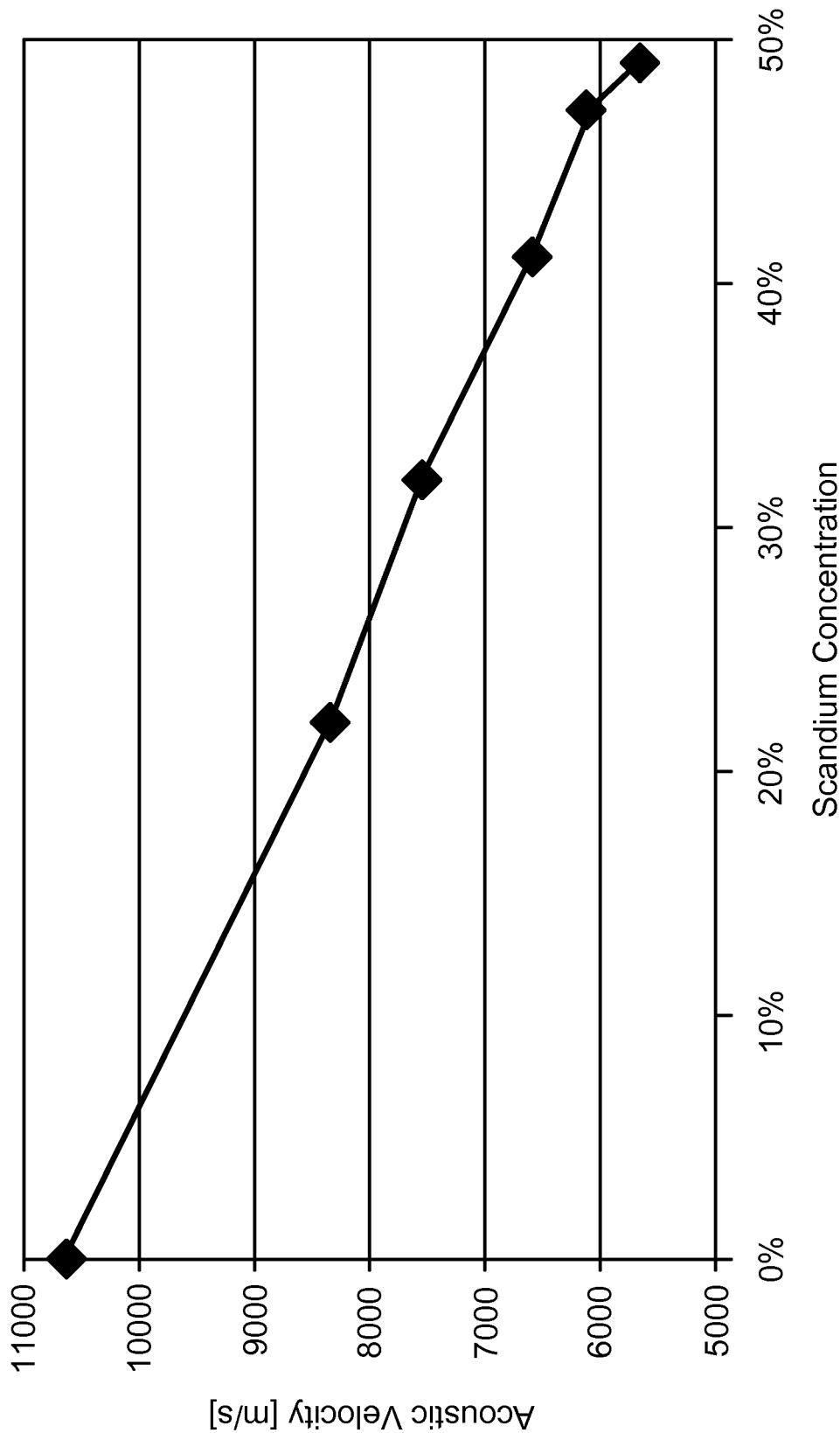
FIG. 5 shows an example representative relationship between the acoustic velocity and the Sc dopant concentration in an AlN thin-film piezoelectric layer.

In some implementations, the dopant particles include one or more of Scandium (Sc) ions, Erbium (Er) ions, Chromium (Cr) ions, or one or more other types of ions. In some implementations, Sc is used as the dopant and AlN is used to form the structural layer 210. FIG. 4 shows a plot depicting example representative relationships between the elastic modulus and the Sc dopant concentration in an AlN thin-film piezoelectric layer and between the mass density and the Sc dopant concentration in the AlN thin-film piezoelectric layer. FIG. 5 shows an example representative relationship between the acoustic velocity and the Sc dopant concentration in an AlN thin-film piezoelectric layer.

Figure 2E:
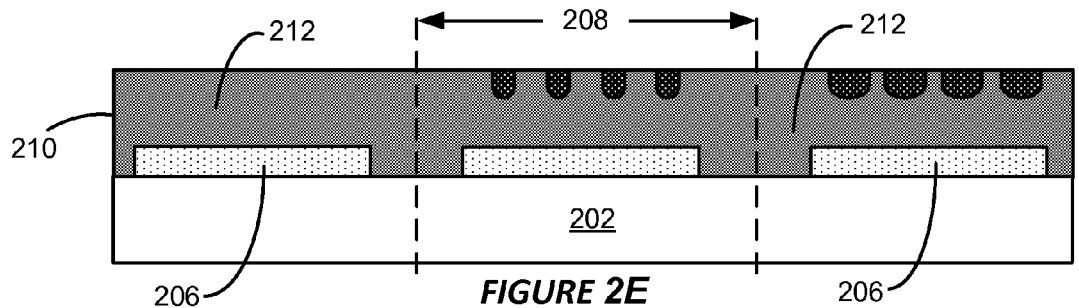
Figure 2F:
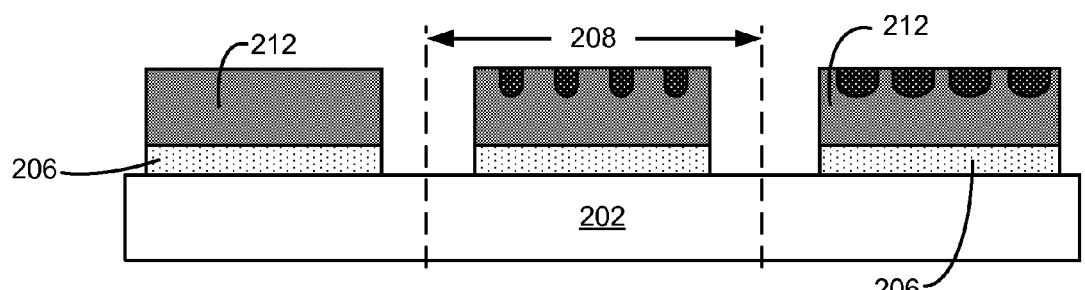

In some implementations, after the desired dopant concentrations are achieved in block 108, the process 100 proceeds in block 110 with removing the mask layer 214, as FIG. 2E shows. In some implementations, other portions of the structural layer 210 along the boundaries of the device regions 208 are removed in block 112 to physically isolate the structural portions 212 of each of the resultant acoustic wave devices 240 from one another, as FIG. 2F shows. For example, reactive-ion etching may be used to separate the structural portions 212. In some implementations, the spacing between adjacent result devices is in the range of approximately 10 to approximately 1000 μm. Although other spacings may be desired in other implementations.

Figure 2G:
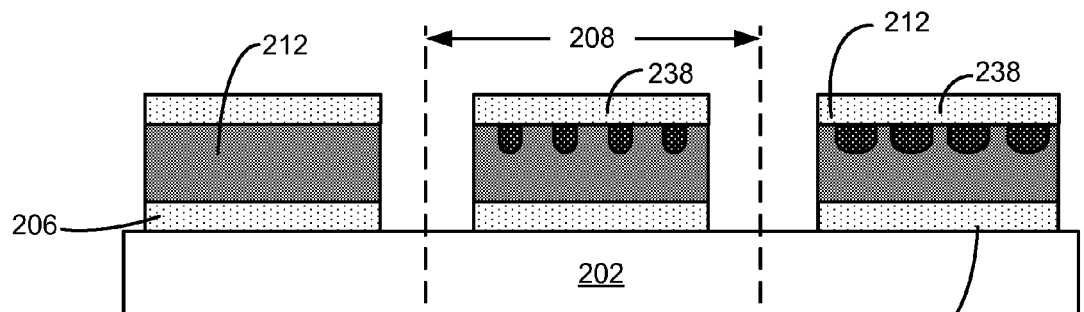

In some implementations, the process 100 then proceeds in block 114 with depositing and patterning an upper conductive layer over the structural layer 210 to form a plurality of sets of upper electrodes 238, as FIG. 2G shows (in some other implementations, the upper conductive layer may be applied prior to isolating or separating the devices in block 112). As with each set of lower electrodes 206, each set of upper electrodes 238 also can include one or more upper electrodes 238 formed of one or more of the materials described above for forming the lower electrodes 206. One or more other layers also can be deposited prior to or after the upper conductive layer. In one example implementation, each top electrode includes a Mo layer having a thickness of approximately 1200 Å. In some implementations, the structural portions 212 are topped with a cap layer formed of AlN after depositing the upper electrodes 238. In some implementations, the substrate 202 is topped with a cap layer formed of AlN prior to depositing the lower electrodes 206.

Figure 2H:
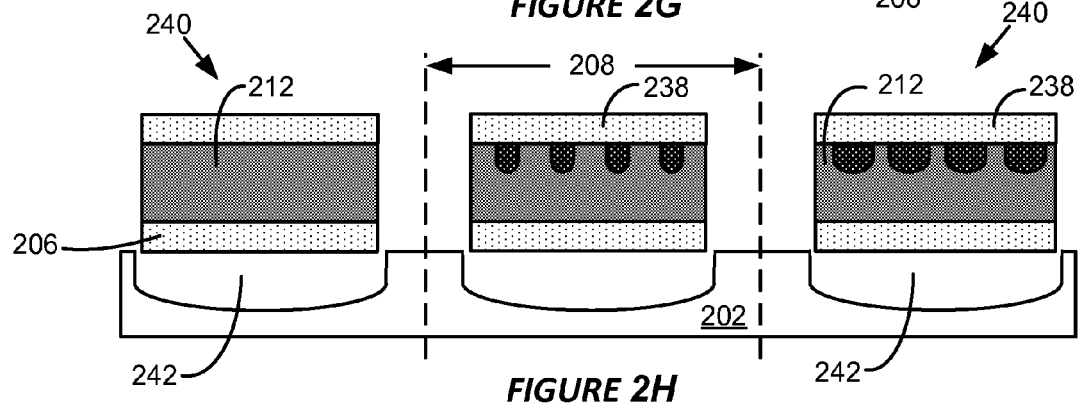

In some implementations, a portion of the substrate 202 below each structural portion 212 is then removed in block 116 to define an air gap or cavity 242 below each structural portion 212 to acoustically isolate the structural portion 212, as FIG. 2H shows. In some implementations, the cavity 242 can be etched or otherwise created by removing portions of the substrate 202 or portions of a sacrificial layer below each of the resultant acoustic wave devices 240 to enable the acoustic wave devices 240 to vibrate freely in response to, for example, stimuli (such as electromagnetic, electrostatic, thermal, optical, magnetic, etc.). For example, a resultant acoustic wave device 240 can be stimulated by appropriated application of electric signals to ones of the lower or upper electrodes 206 and 238 resulting in the production of electric fields within the structural portion 212 of the device 240. In this manner, an array of acoustic wave devices 240 can be produced at a batch-level on a single substrate with the same thickness yet having selectively-prescribed resonant or operating frequencies or other acoustic, electromechanical or other desired characteristics.

While a particular process 100 and a particular resultant device 240 have been described with reference to FIG. 1, FIGS. 2A-2H and FIG. 3, numerous variations can be practiced or applied in various other implementations. For example, some implementations can include one or more of the variations described below.

In some implementations, only an upper conductive layer, only a lower conductive layer, or neither an upper conductive layer nor a lower conductive layer are included. For example, in some implementations, the resultant device 240 does not include a lower conductor 204, and hence, no bottom electrodes 206. For example, the process 100 could be modified such that it no longer includes block 102—depositing and patterning a lower conductive layer 204 over the substrate 202. In some such implementations, the process 100 can begin in block 104 with depositing the structural layer 210. In some such implementations or in other implementations, the resultant device 240 does not include an upper conductive layer, and hence, no top electrodes 238. For example, the process 100 could be modified such that it no longer includes block 114—depositing and patterning an upper conductive layer over the structural portions 212.

In some implementations, instead of or in addition to depositing and patterning a lower conductive layer to produce lower electrodes, the process 100 can be modified to deposit and pattern other layers and to form other structures. For example, in some implementations, the process 100 is modified to fabricate one or more acoustic reflectors or one or more adhesion layers in each device region 208. In some implementations, the process 100 can be modified to form other layers or structures over or under the structural layer 210.

Figure 6:
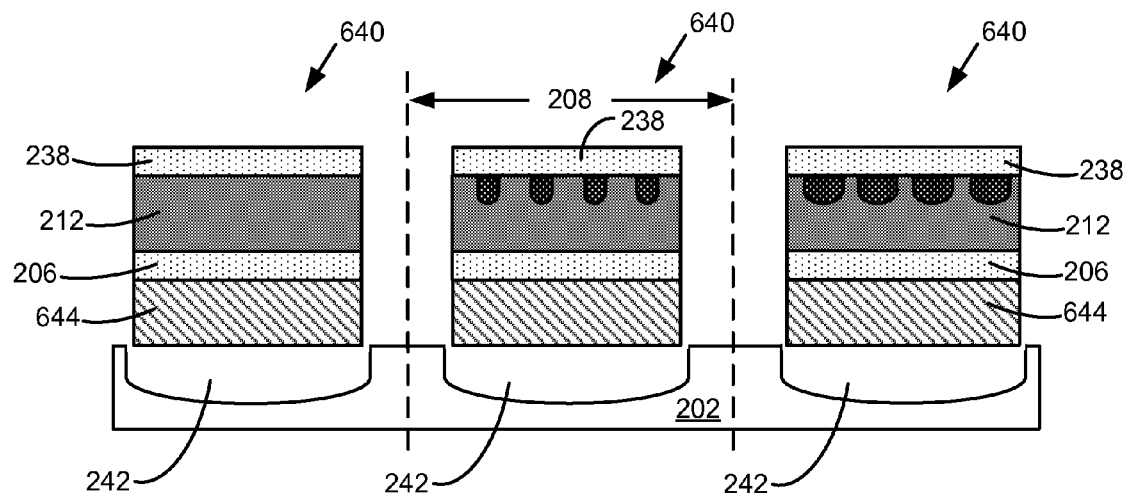
FIG. 6 shows a cross-sectional schematic depiction of an example stage or result of another process for forming an array of acoustic wave devices.

FIG. 6 shows a cross-sectional schematic depiction of an example stage or result of another process for forming an array of acoustic wave devices 640. Like the acoustic wave devices 240 described with reference to the process 100 of FIG. 1 and the cross-sectional schematic depictions of the example stages of FIGS. 2A-2H, the acoustic wave devices 640 can be produced at a batch-level on a single substrate with the same thickness and yet have selectively-prescribed resonant or operating frequencies or other acoustic, electromechanical or other desired characteristics. Similar to the acoustic devices 240 shown in FIG. 2H, each acoustic wave device 640 shown in FIG. 6 includes a structural portion 212 that can be doped according to, for example, the techniques described above with reference to the process 100, and specifically, the masking and ion implantation operations of blocks 106 and 108. Each acoustic wave device 640 also can include one or more bottom electrodes 206, one or more top electrodes 238 and a cavity 242, among other variations. Unlike the acoustic devices 240, each acoustic wave device 640 also includes an elastic portion 644 below the structural portion 212 (and below the bottom electrodes 206 if present). For example, the elastic portion 644 can be formed over the substrate 202 (and over any sacrificial layers if present) prior to the deposition of the lower conductive layer 206 (if present) and prior to the deposition of the structural layer 210 described above with reference to the process 100. Like the structural layer 210 described above, the elastic portions 644 can be deposited in the form of a single layer. Portions of the elastic layer along the boundaries of the device regions 608 can then be removed (such as in block 112 described above) to physically isolate the elastic portions 644. Some such implementations of the acoustic wave devices 640 can be referred to as compound piezoelectric resonators.

Figure 7:
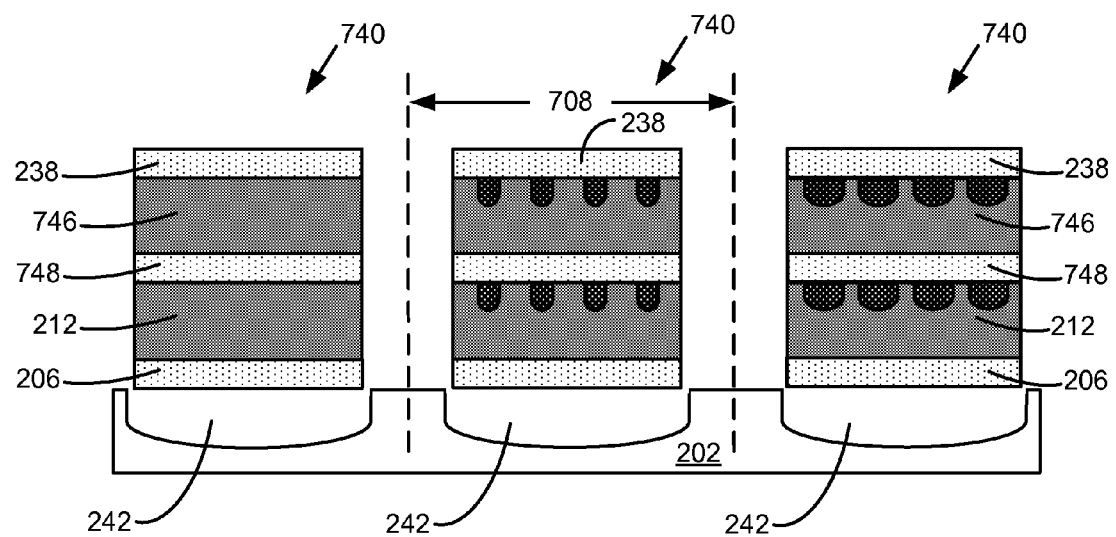
FIG. 7 shows a cross-sectional schematic depiction of an example stage or result of another process for forming an array of acoustic wave devices.

FIG. 7 shows a cross-sectional schematic depiction of an example stage or result of another process for forming an array of acoustic wave devices 740. Like the acoustic wave devices 240 described with reference to the process 100 of FIG. 1 and the cross-sectional schematic depictions of the example stages of FIGS. 2A-2H, the acoustic wave devices 740 can be produced at a batch-level on a single substrate with the same thickness and yet have selectively-prescribed resonant or operating frequencies or other acoustic, electromechanical or other desired characteristics. Similar to the acoustic devices 240 shown in FIG. 2H, each acoustic wave device 740 shown in FIG. 7 includes a structural portion 212 that can be doped according to, for example, the techniques described above with reference to the process 100, and specifically, the masking and ion implantation operations of blocks 106 and 108. Each acoustic wave device 740 also can include one or more bottom electrodes 206, one or more top electrodes 238 and a cavity 242, among other variations. Unlike the acoustic devices 240, each acoustic wave device 740 also includes a second structural portion 746 above the structural portion 212. For example, the second structural portion also can be formed of a piezoelectric material such as AlN, ZnO or PZT, among other possibilities. In some such implementations, each acoustic device 740 also includes one or more middle electrodes 748.

Again, in some implementations, the process 100 described above can be modified to produce the acoustic devices 740. For example, in some implementations, after implanting the dopant particles in block 108 and removing the mask layer in block 110, a middle conductive layer is then deposited and patterned to produce the one or more middle electrodes 748 in each device region 708. In some implementations, the second structural portions 746 are then deposited over the middle electrodes 748 in the form of a single second structural layer. In some such implementations, the second structural layer also can be doped. For example, after depositing the second structural layer, a mask layer can be applied as described above with reference to block 106 of the process 100. A doping operation also can then be performed as described above with reference to block 108 of the process 100. In some other implementations, only the second structural layer is masked and doped as described with reference to blocks 106 and 108; that is, in such implementations, the middle electrodes 748 and the second structural portions 746 are deposited over the first structural layer 210 without masking and doping the first structural layer. In some other implementations, the first structural portions 212 are masked and doped but the second structural portions 746 are not masked and not doped.

As just described, like the structural portions 212, the second structural portions 746 also can be deposited in the form of a single layer. Portions of the second structural layer along the boundaries of the device regions 708 can then be removed (such as in block 112 described above) to physically isolate the structural portions 746. Some such implementations of the acoustic wave devices 740 also can be referred to as compound piezoelectric resonators.

In some other implementations, the structural layer 210 can be formed of Si or another dielectric or semiconductor material. In some such Si implementations, the silicon structural layer can be formed of amorphous Si, poly-crystalline Si, single-crystal Si, a Si oxide, a Si nitride or oxy-nitride, or a combination of one or more of these. For example, in some implementations, when the resultant acoustic device will be configured as a delay line or delay line oscillator, the structural device layer can be formed of a dielectric or semiconducting material such as, for example, Si. Such a Si structural layer also can be doped according to, for example, the techniques described above with reference to the process 100, and specifically, the masking and ion implantation operations of blocks 106 and 108.

In some implementations, the structural layer 210 is not a thin-film layer. For example, in some implementations, the process 100 can be modified such that, in block 104, a bulk structural device layer 210 is deposited. In some implementations, the structural layer 210 can be a bulk material with a thickness in the range of, for example, approximately 5 μm to approximately 200 μm. In some implementations, the structural layer is a bulk material such as single crystal Si. In some other implementations, the structural layer 210 can have a smaller or larger thickness. In some other implementations, the structural layer 210 may comprise more than one thin film layer (such as AlN and $SiO_2$) or a combination of thin film and bulk material layers (such as AlN and silicon-on-insulator (SOI)). Such structural layers also can be doped according to, for example, the techniques described above with reference to the process 100, and specifically, the masking and ion implantation operations of blocks 106 and 108.

Figure 8:
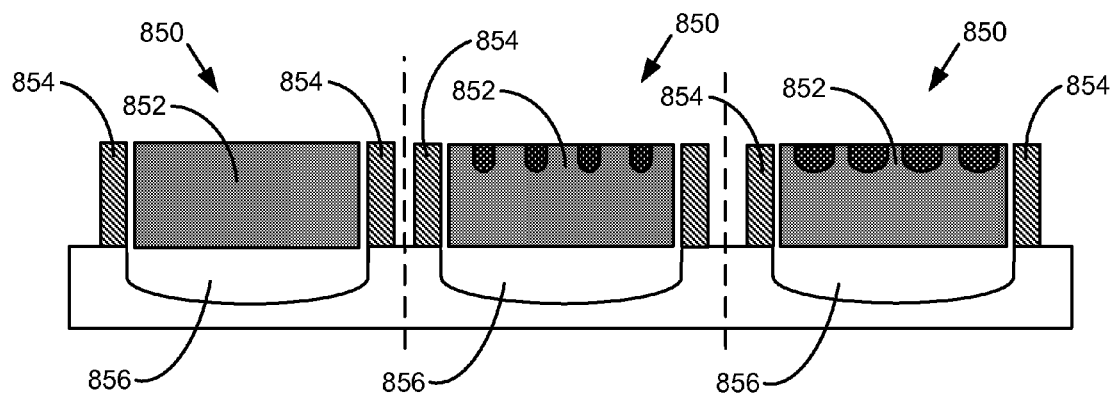
FIG. 8 shows a cross-sectional schematic depiction of an example stage or result of another process for forming an array of acoustic wave devices.

FIG. 8 shows a cross-sectional schematic depiction of an example stage or result of another process for forming an array of acoustic wave devices 850. For example, each of the acoustic wave acoustic wave devices 850 can be configured in the form of an electrostatic thin-film CMR. The acoustic wave devices 850 also can be produced at a batch-level on a single substrate with the same thickness and yet have selectively-prescribed resonant or operating frequencies or other acoustic, electromechanical or other desired characteristics. Similar to the acoustic devices 240 shown in FIG. 2H, each acoustic wave device 850 shown in FIG. 8 includes a structural portion 852 that can be doped according to, for example, the techniques described above with reference to the process 100, and specifically, the masking and ion implantation operations of blocks 106 and 108. In some implementations, the structural portion 852 can be formed of Si or another dielectric or semiconductor material. Each acoustic wave device 850 also can include one or more transduction electrodes 854 used in electrostatically-transducing the structural portion 852. Each acoustic wave device 850 also includes a cavity 856.

Figure 9:
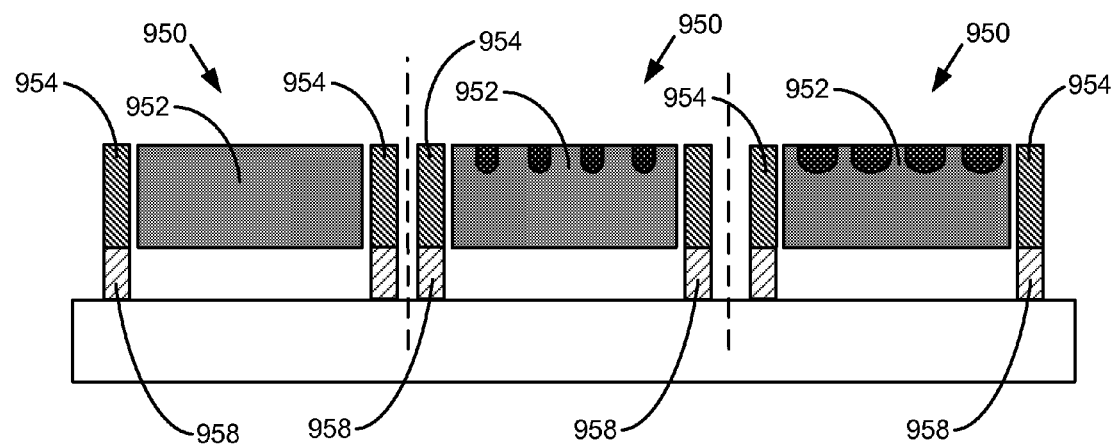
FIG. 9 shows a cross-sectional schematic depiction of an example stage or result of another process for forming an array of acoustic wave devices.

FIG. 9 shows a cross-sectional schematic depiction of an example stage or result of another process for forming an array of acoustic wave devices 950. The acoustic wave devices 950 also can be produced at a batch-level on a single substrate with the same thickness and yet have selectively-prescribed resonant or operating frequencies or other acoustic, electromechanical or other desired characteristics. Like the acoustic wave devices 850 described with reference to FIG. 8, the acoustic wave devices 950 also are electrostatically-transduced. Similar to the acoustic devices 850 shown in FIG. 8, each acoustic wave device 950 shown in FIG. 9 includes a structural portion 952 that can be doped according to, for example, the techniques described above with reference to the process 100, and specifically, the masking and ion implantation operations of blocks 106 and 108. In some implementations, the structural portion 952 can be formed of Si or another dielectric or semiconductor material. Each acoustic wave device 950 also can include one or more transduction electrodes 954 used in electrostatically-transducing the structural portion 952. Each of the acoustic wave acoustic wave devices 950 can be configured in the form of an electrostatic silicon-on-insulator (SOI) CMR. In such implementations, rather than by etching a cavity 856 into the substrate 902, the structural portion 952 is acoustically isolated from the substrate 902 by standoffs 958 and tethers (not shown).

Figure 10:
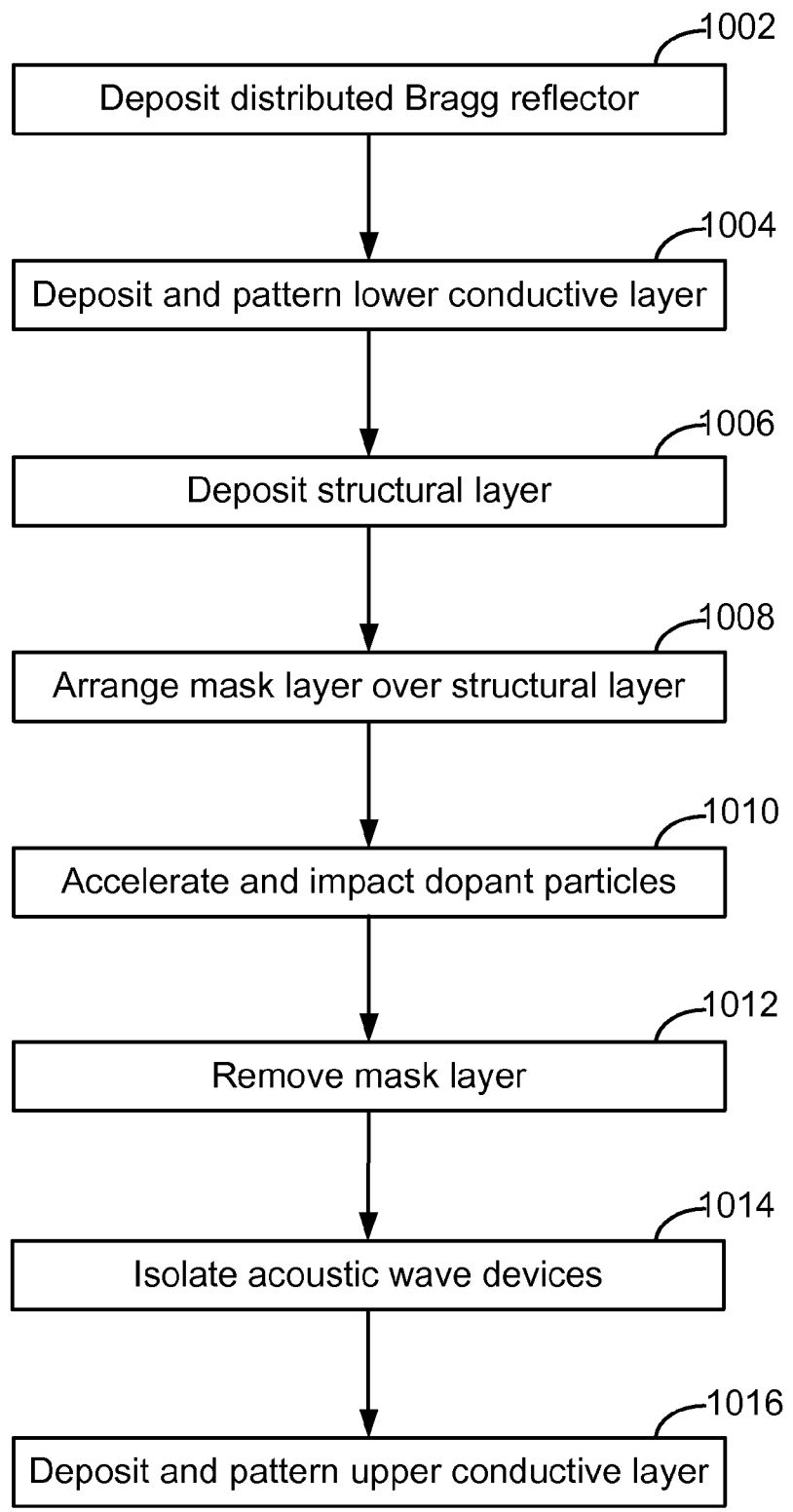
FIG. 10 shows an example of a flow diagram illustrating a process for forming an array of acoustic wave devices.
Figure 11A:
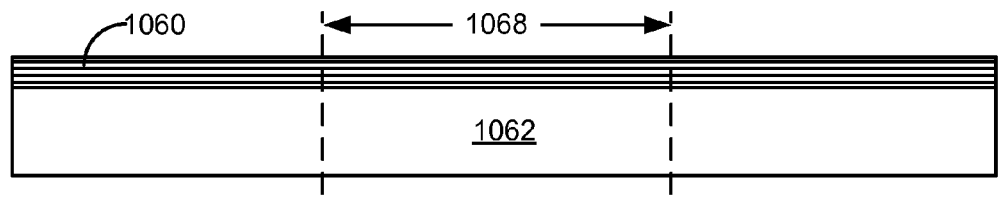
FIGS. 11A, 11B, 11C, 11D, 11E, 11F, 11G and 11H show cross-sectional schematic depictions of example stages in a process as, for example, described with reference to FIG. 10.

In some other implementations, an array of solidly-mounted resonator (SMR)-type devices can be formed. FIG. 10 shows an example of a flow diagram illustrating a process for forming an array of SMRs. FIGS. 11A-11H show cross-sectional schematic depictions of example stages in a process as, for example, described with reference to FIG. 10. In some implementations, the process 1000 begins in block 1002 with depositing and patterning an acoustic distributed Bragg reflector (DBR) 1060 over a substrate 1062, as FIG. 11A shows. For example, the DBR (or DBR layer) 1060 can typically include alternating quarter-wavelength thick layers of high (such as tungsten (W)) and low (such as $SiO_2$) acoustic impedance layers. In some implementations, the substrate 1062 can be formed of a dielectric or semiconducting material. In some implementations, the substrate 1062 can be a plate or a wafer, such as a Si wafer.

Again, while only three device regions 1068 are shown in FIGS. 11A-11H, in other implementations, the substrate 1062 can include arrays of tens, hundreds, thousands, or more, of the device regions 1068 enabling the production of as many acoustic wave devices on the substrate 1062.

Figure 11B:
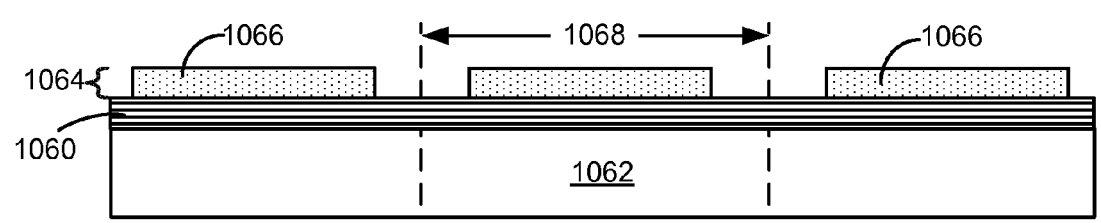
Figure 11C:
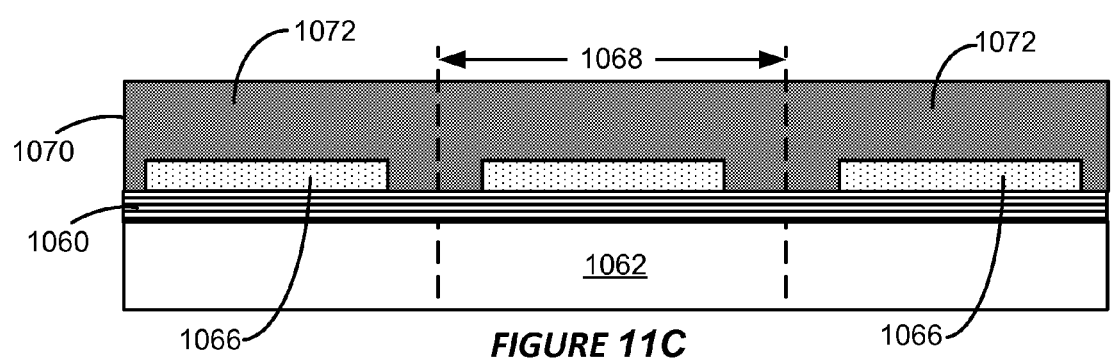

In some implementations, the process 1000 proceeds in block 1004 with depositing and patterning a lower conductive layer 1064 over a substrate 1062 to form a plurality of sets of lower electrodes 1066, as FIG. 11B shows. In some implementations, the process 1000 proceeds in block 1006 with depositing a structural layer 1070 over the lower conductive layer 1064, as FIG. 11C shows. The structural layer 1070 includes a plurality of structural portions 1072 that each correspond in footprint with a corresponding device region 1068. In some implementations, the structural layer 1070 is formed from a piezoelectric material. The piezoelectric materials that can be used in fabrication of the structural layer 1070 include, for example, those described above with reference to the process 100 of FIG. 1.

Figure 11D:
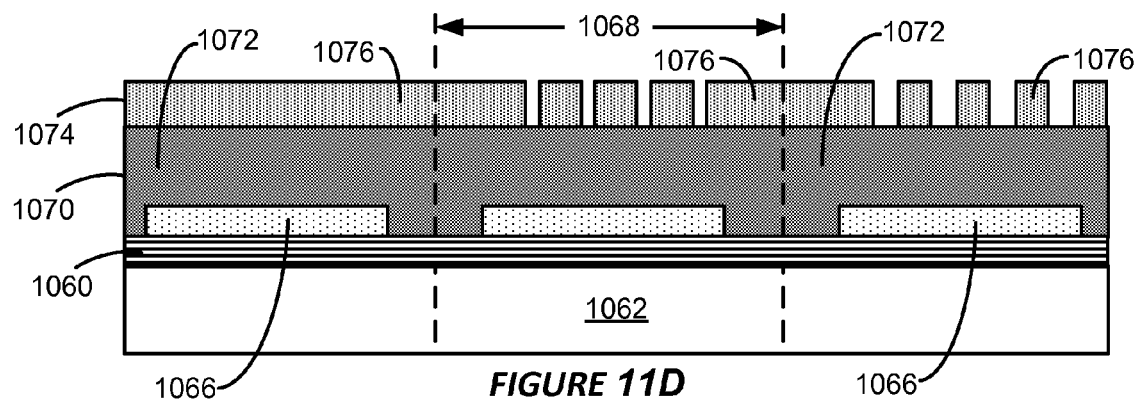
Figure 11E:
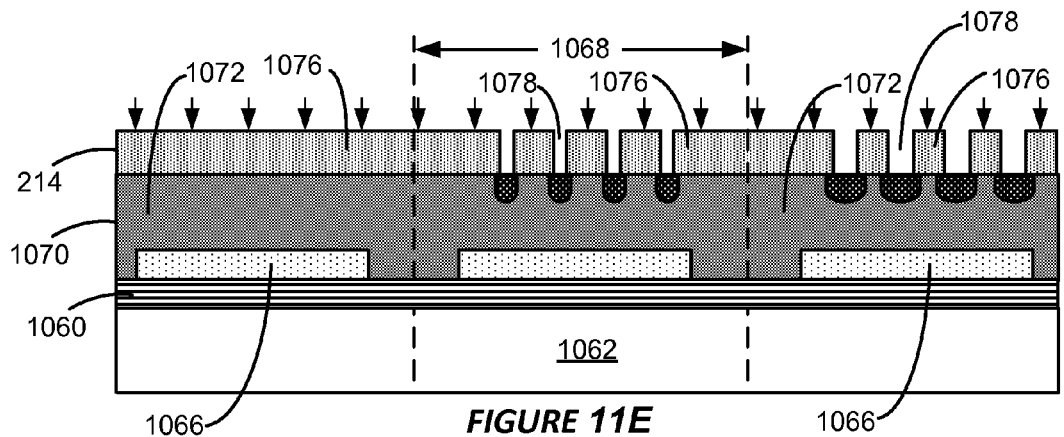

In some implementations, a mask layer 1074 is then arranged in block 1008 over the structural layer 1070, as FIG. 11D shows. The mask layer 1074 includes a plurality of mask portions 1076. Each mask portion 1076 includes a number of mask openings 1078 that expose corresponding underlying regions of the structural portion 1072 below the mask portion 1076 as, for example, described with reference to the process 100 of FIG. 1. In some implementations, the process 1000 proceeds in block 1010 with accelerating dopant particles toward the mask layer 1074, as FIG. 11E shows. As described above with reference to the process 100 of FIG. 1, for each acoustic wave device formed or to be formed in a region 1068, the accelerated dopant particles that proceed through the mask openings 1078 in the corresponding mask portion 1076 of the acoustic wave device are impacted into the corresponding structural portion 212 of the acoustic wave device. The impacted dopant particles modify one or more material properties in the structural portion 1072. The modified material properties, in turn, effect a change in one or more acoustic or electromechanical characteristics of the resultant acoustic wave device in each particular device region 1068.

As described above with reference to the process 100 of FIG. 1, one or more ion implantation techniques can be used to accelerate and impact the dopant particles. In this way, the dopant particles can be accelerated toward substantially the entire mask layer at substantially the same time and for substantially the same duration. However, despite the equal or substantially equal duration of the doping over each device region 1068, a multitude of differently behaving acoustic devices can be formed because of the variety in the selection and arrangement of the mask portions 1076 and corresponding mask openings 1078. Additionally, as described above, the mask portions 1076 of a given mask layer 1074 can advantageously include mask portions of a plurality of types or sets.

Figure 11F:
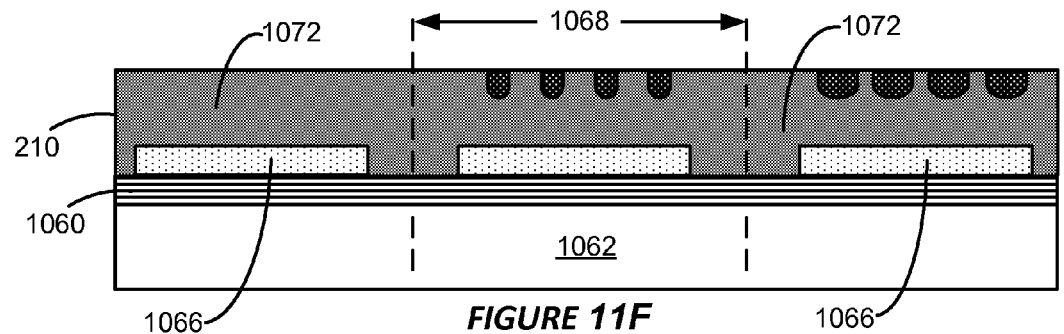
Figure 11G:
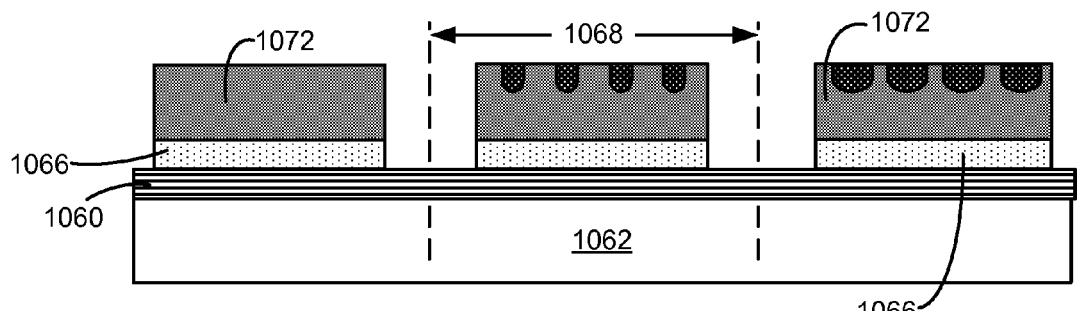
Figure 11H:
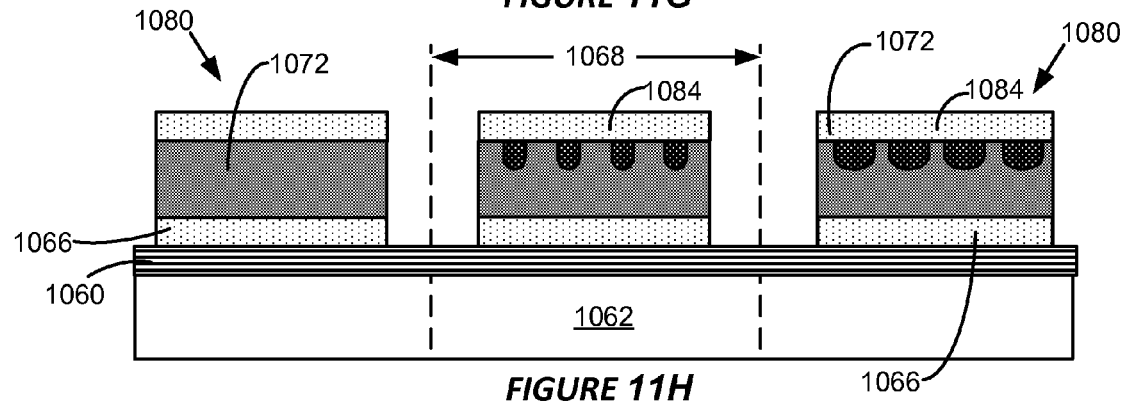

In some implementations, after the desired dopant concentrations are achieved in block 1008, the process 1000 proceeds in block 1012 with removing the mask layer 1074, as FIG. 11F shows. In some implementations, other portions of the structural layer 1070 along the boundaries of the device regions 1068 are removed in block 1014 to physically isolate the structural portions 1072 of each of the resultant acoustic wave devices 1080 from one another, as FIG. 11G shows. In some implementations, the process 1000 then proceeds in block 1016 with depositing and patterning an upper conductive layer over the structural layer 1070 to form a plurality of sets of upper electrodes 1084, as FIG. 11H shows (in some other implementations, the upper conductive layer may be applied prior to isolating or separating the devices in block 1012).

As compared to industry-standard filter solutions based on discrete acoustic wave devices (such as SAW and FBAR/BAW), some example implementations enable or provide some or all of the following advantages: a reduction in module assembly cost, time and complexity by minimizing the bill of materials (BOM); and elimination of the need for multiple packages thereby reducing cost, size and possibly yield loss. Furthermore, compared to other known multi-frequency CMR based concepts, some example implementations enable or provide some or all of the following advantages: greater electromechanical coupling, which enables wider bandwidth, lower insertion loss, and facilitated matching to 50 ohm RF systems; and compatibility with existing fabrication technologies and design techniques. Some example implementations also fit a more compact form factor and achieve greater performance as a result of a higher resonator quality factor (Q).

Figure 12A:
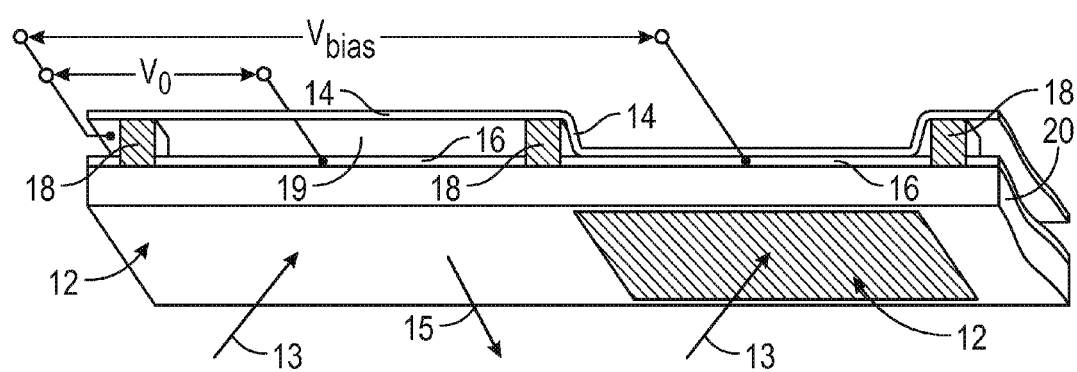
FIG. 12A shows an isometric view illustration depicting two adjacent interferometric modulator (IMOD) display elements in a series or array of display elements of an IMOD display device.

FIG. 12A shows an isometric view illustration depicting two adjacent interferometric modulator (IMOD) display elements in a series or array of display elements of an IMOD display device. The IMOD display device includes one or more interferometric EMS, such as MEMS, display elements. In these devices, the interferometric MEMS display elements can be configured in either a bright or dark state. In the bright ("relaxed," "open" or "on," etc.) state, the display element reflects a large portion of incident visible light. Conversely, in the dark ("actuated," "closed" or "off," etc.) state, the display element reflects little incident visible light. MEMS display elements can be configured to reflect predominantly at particular wavelengths of light allowing for a color display in addition to black and white. In some implementations, by using multiple display elements, different intensities of color primaries and shades of gray can be achieved.

The IMOD display device can include an array of IMOD display elements which may be arranged in rows and columns. Each display element in the array can include at least a pair of reflective and semi-reflective layers, such as a movable reflective layer (i.e., a movable layer, also referred to as a mechanical layer) and a fixed partially reflective layer (i.e., a stationary layer), positioned at a variable and controllable distance from each other to form an air gap (also referred to as an optical gap, cavity or optical resonant cavity). The movable reflective layer may be moved between at least two positions. For example, in a first position, i.e., a relaxed position, the movable reflective layer can be positioned at a distance from the fixed partially reflective layer. In a second position, i.e., an actuated position, the movable reflective layer can be positioned more closely to the partially reflective layer. Incident light that reflects from the two layers can interfere constructively and/or destructively depending on the position of the movable reflective layer and the wavelength(s) of the incident light, producing either an overall reflective or non-reflective state for each display element. In some implementations, the display element may be in a reflective state when unactuated, reflecting light within the visible spectrum, and may be in a dark state when actuated, absorbing and/or destructively interfering light within the visible range. In some other implementations, however, an IMOD display element may be in a dark state when unactuated, and in a reflective state when actuated. In some implementations, the introduction of an applied voltage can drive the display elements to change states. In some other implementations, an applied charge can drive the display elements to change states.

The depicted portion of the array in FIG. 12A includes two adjacent interferometric MEMS display elements in the form of IMOD display elements 12. In the display element 12 on the right (as illustrated), the movable reflective layer 14 is illustrated in an actuated position near, adjacent or touching the optical stack 16. The voltage $V_{bias}$ applied across the display element 12 on the right is sufficient to move and also maintain the movable reflective layer 14 in the actuated position. In the display element 12 on the left (as illustrated), a movable reflective layer 14 is illustrated in a relaxed position at a distance (which may be predetermined based on design parameters) from an optical stack 16, which includes a partially reflective layer. The voltage $V_0$ applied across the display element 12 on the left is insufficient to cause actuation of the movable reflective layer 14 to an actuated position such as that of the display element 12 on the right.

In FIG. 12A, the reflective properties of IMOD display elements 12 are generally illustrated with arrows indicating light 13 incident upon the IMOD display elements 12, and light 15 reflecting from the display element 12 on the left. Most of the light 13 incident upon the display elements 12 may be transmitted through the transparent substrate 20, toward the optical stack 16. A portion of the light incident upon the optical stack 16 may be transmitted through the partially reflective layer of the optical stack 16, and a portion will be reflected back through the transparent substrate 20. The portion of light 13 that is transmitted through the optical stack 16 may be reflected from the movable reflective layer 14, back toward (and through) the transparent substrate 20. Interference (constructive and/or destructive) between the light reflected from the partially reflective layer of the optical stack 16 and the light reflected from the movable reflective layer 14 will determine in part the intensity of wavelength(s) of light 15 reflected from the display element 12 on the viewing or substrate side of the device. In some implementations, the transparent substrate 20 can be a glass substrate (sometimes referred to as a glass plate or panel). The glass substrate may be or include, for example, a borosilicate glass, a soda lime glass, quartz, Pyrex, or other suitable glass material. In some implementations, the glass substrate may have a thickness of 0.3, 0.5 or 0.7 millimeters, although in some implementations the glass substrate can be thicker (such as tens of millimeters) or thinner (such as less than 0.3 millimeters). In some implementations, a non-glass substrate can be used, such as a polycarbonate, acrylic, polyethylene terephthalate (PET) or polyether ether ketone (PEEK) substrate. In such an implementation, the non-glass substrate will likely have a thickness of less than 0.7 millimeters, although the substrate may be thicker depending on the design considerations. In some implementations, a non-transparent substrate, such as a metal foil or stainless steel-based substrate can be used. For example, a reverse-IMOD-based display, which includes a fixed reflective layer and a movable layer which is partially transmissive and partially reflective, may be configured to be viewed from the opposite side of a substrate as the display elements 12 of FIG. 12A and may be supported by a non-transparent substrate.

The optical stack 16 can include a single layer or several layers. The layer(s) can include one or more of an electrode layer, a partially reflective and partially transmissive layer, and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals (such as chromium and/or molybdenum), semiconductors, and dielectrics. The partially reflective layer can be formed of one or more layers of materials, and each of the layers can be formed of a single material or a combination of materials. In some implementations, certain portions of the optical stack 16 can include a single semi-transparent thickness of metal or semiconductor which serves as both a partial optical absorber and electrical conductor, while different, electrically more conductive layers or portions (such as of the optical stack 16 or of other structures of the display element) can serve to bus signals between IMOD display elements. The optical stack 16 also can include one or more insulating or dielectric layers covering one or more conductive layers or an electrically conductive/partially absorptive layer.

In some implementations, at least some of the layer(s) of the optical stack 16 can be patterned into parallel strips, and may form row electrodes in a display device as described further below. As will be understood by one having ordinary skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of supports, such as the illustrated posts 18, and an intervening sacrificial material located between the posts 18. When the sacrificial material is etched away, a defined gap 19, or optical cavity, can be formed between the movable reflective layer 14 and the optical stack 16. In some implementations, the spacing between posts 18 may be approximately 1-1000 μm, while the gap 19 may be approximately less than 10,000 Angstroms (Å).

In some implementations, each IMOD display element, whether in the actuated or relaxed state, can be considered as a capacitor formed by the fixed and moving reflective layers. When no voltage is applied, the movable reflective layer 14 remains in a mechanically relaxed state, as illustrated by the display element 12 on the left in FIG. 12A, with the gap 19 between the movable reflective layer 14 and optical stack 16. However, when a potential difference, i.e., a voltage, is applied to at least one of a selected row and column, the capacitor formed at the intersection of the row and column electrodes at the corresponding display element becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated display element 12 on the right in FIG. 12A. The behavior can be the same regardless of the polarity of the applied potential difference. Though a series of display elements in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. In some implementations, the rows may be referred to as "common" lines and the columns may be referred to as "segment" lines, or vice versa. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 12B:
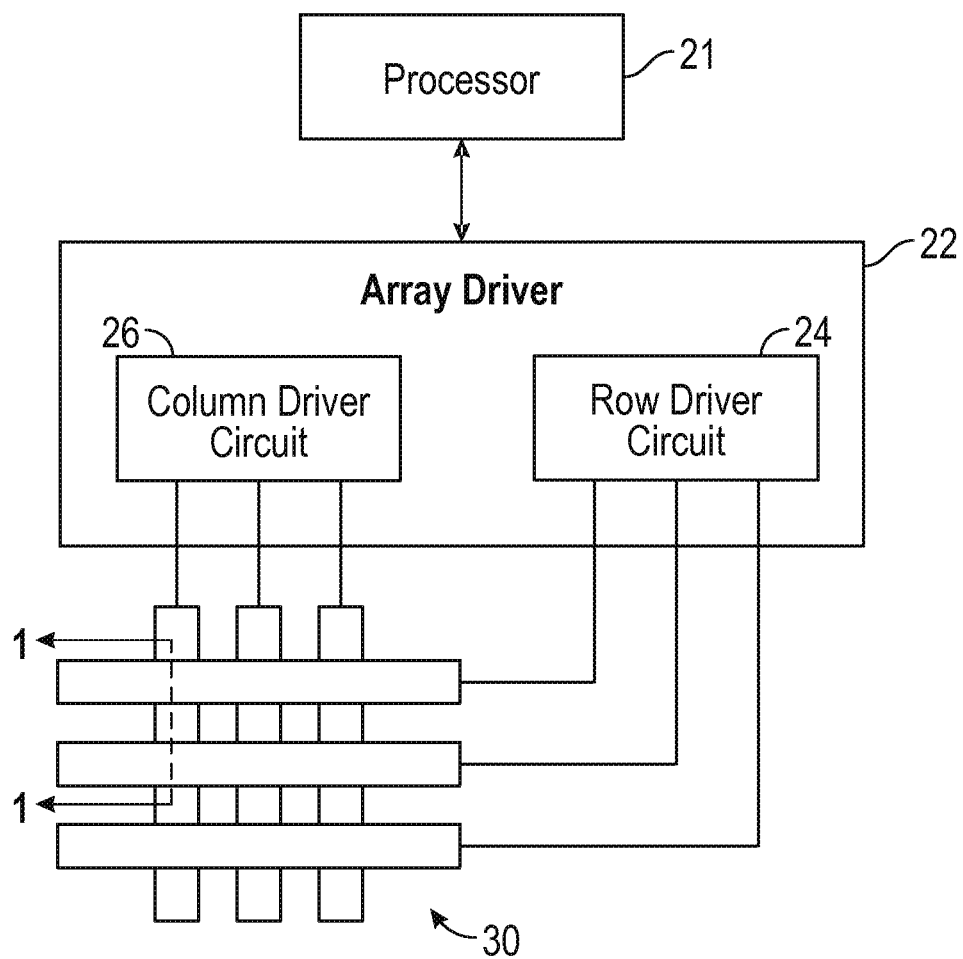
FIG. 12B shows a system block diagram illustrating an electronic device incorporating an IMOD-based display including a three element by three element array of IMOD display elements.

FIG. 12B shows a system block diagram illustrating an electronic device incorporating an IMOD-based display including a three element by three element array of IMOD display elements. The electronic device includes a processor 21 that may be configured to execute one or more software modules. In addition to executing an operating system, the processor 21 may be configured to execute one or more software applications, including a web browser, a telephone application, an email program, or any other software application.

The processor 21 can be configured to communicate with an array driver 22. The array driver 22 can include a row driver circuit 24 and a column driver circuit 26 that provide signals to, for example a display array or panel 30. The cross section of the IMOD display device illustrated in FIG. 12A is shown by the lines 1-1 in FIG. 12B. Although FIG. 12B illustrates a 3×3 array of IMOD display elements for the sake of clarity, the display array 30 may contain a very large number of IMOD display elements, and may have a different number of IMOD display elements in rows than in columns, and vice versa.

Figure 13A:
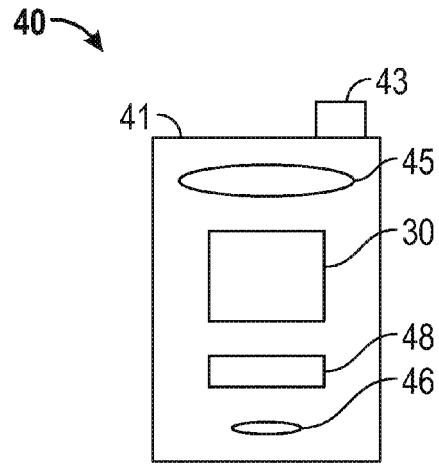
FIGS. 13A and 13B show system block diagrams illustrating a display device that includes a plurality of IMOD display elements.
Figure 13B:
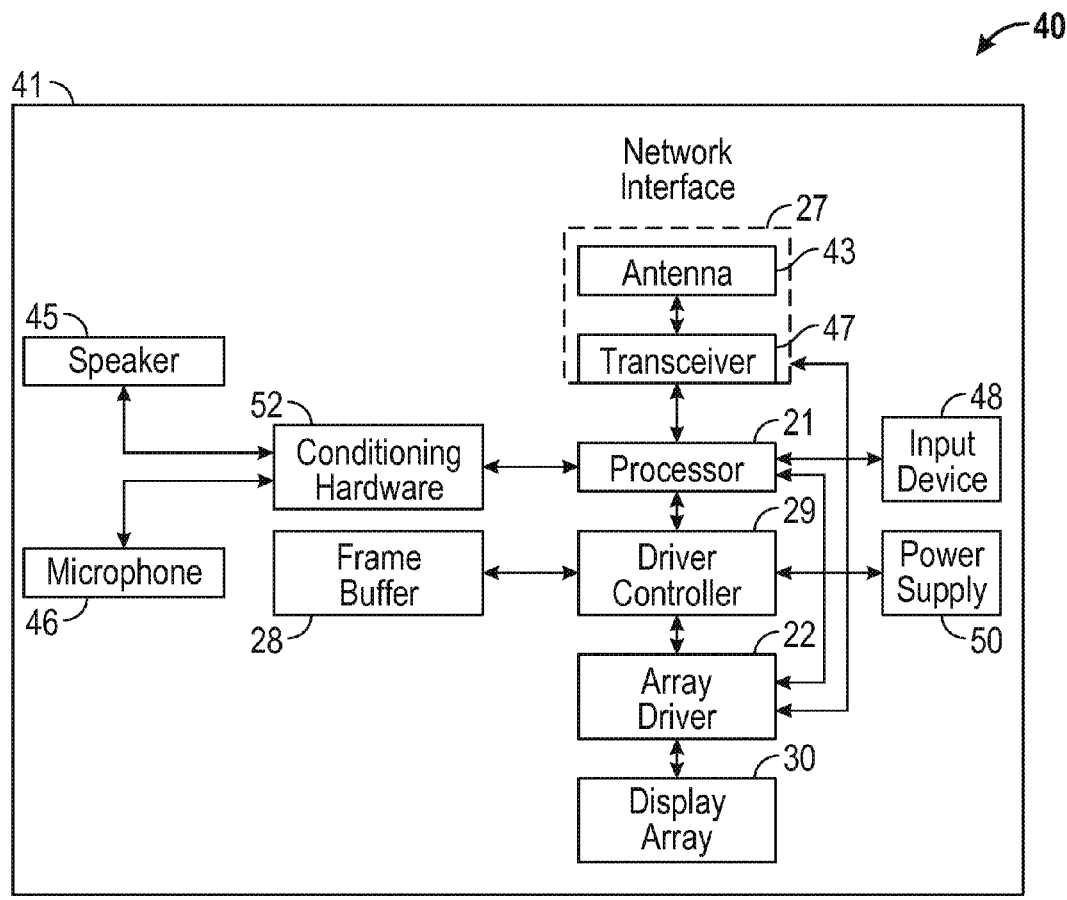

FIGS. 13A and 13B show system block diagrams illustrating a display device 40 that includes a plurality of IMOD display elements. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an IMOD-based display, as described herein.

The components of the display device 40 are schematically illustrated in FIG. 13A. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 13A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1×EV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can preprocess the signals received from the antenna 43 so that they may be received by and further manipulated by the processor

21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller (such as an IMOD display element controller). Additionally, the array driver 22 can be a conventional driver or a bi-stable display driver (such as an IMOD display element driver). Moreover, the display array 30 can be a conventional display array or a bi-stable display array (such as a display including an array of IMOD display elements). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of, such as an IMOD display element as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A device comprising:
    a substrate;
    a plurality of resonators on the substrate, the plurality of resonators including a plurality of sets of resonators, each set of resonators including one or more of the plurality of resonators, each of the resonators including:
        at least one first electrode;
        at least one second electrode;
        a structural portion having a thickness between the at least one first electrode and the at least one second electrode, at least one resonant frequency of the resonator being based on the thickness; and
        a dopant particle concentration in the structural portion, the dopant particle concentration including one or more types of dopant particles, one or more acoustic characteristics of the resonator being based on the dopant particle concentration;
    the thickness of the structural portion of each resonator being approximately equal to the thicknesses of the structural portions of all the other resonators and
    the dopant particle concentration in the structural portion of each resonator in each set of resonators being approximately the same dopant particle concentration as in the other resonators of the set and different than the dopant particle concentration in the other resonators of all the other sets.

2. The device of claim 1, wherein the one or more acoustic characteristics of each of the resonators include one or more of a frequency response, a resonant frequency, an electromechanical coupling coefficient, and a fractional bandwidth of the resonator.

3. The device of claim 1, wherein a ratio of an elastic stiffness to a mass density of the structural portion of each of the resonators is based on the dopant particle concentration.

4. The device of claim 1, wherein a ratio of a piezoelectric coefficient to a product of a dielectric permittivity and an elastic stiffness of the structural portion of each of the resonators is based on the dopant particle concentration.

5. The device of claim 1, wherein each structural portion is formed of a piezoelectric material.

6. The device of claim 1, wherein the at least one resonant frequency based on the thickness of the structural portion is associated with an elastic wave that propagates along a direction parallel with the thickness.

7. The device of claim 1, wherein at least one resonant frequency of each resonator in at least one of the sets of resonators is based on a dimension along a surface plane of the structural portion.

8. The device of claim 1, wherein the dopant particle concentration is approximately uniform across the thickness of the structural portion.

9. The device of claim 1, wherein the thickness of the structural portion is in the range of approximately 0.5 μm to approximately 4 μm.

10. The device of claim 1, wherein the substrate includes a plurality of cavities, each resonator being above a corresponding one of the cavities.

11. A filter comprising:
    the device of claim 1, wherein each of the plurality of sets of resonators has at least one resonant frequency different than the other sets of resonators.

12. The device of claim 1, further including at least one acoustic reflector between the resonator and the substrate.

13. The device of claim 12, wherein the at least one acoustic reflector includes a distributed Bragg reflector (DBR).

14. A device comprising:
    an array of acoustic wave devices, the array of acoustic wave devices including a plurality of sets of acoustic wave devices, each set of acoustic wave devices including one or more acoustic wave devices, each acoustic wave device including a structural portion having a dopant particle concentration of one or more types of dopant particles;
    the one or more types of dopant particles in each structural portion including Scandium (Sc) ions, Erbium ions (Er), or Chromium (Cr) ions, or combination thereof;
    a thickness of the structural portion of each acoustic wave device being approximately equal to the thicknesses of the structural portions of all the other acoustic wave devices in the array of acoustic wave devices;

the dopant particle concentration in the structural portion of each acoustic wave device in each set of acoustic wave devices being approximately the same dopant particle concentration as in the other acoustic wave devices of the set and different than the dopant particle concentration in the other acoustic wave devices of all the other sets in the array of acoustic wave devices; and one or more material properties of the structural portion of each acoustic wave device being based on the dopant particle concentration in the structural portion, one or more acoustic or electromechanical characteristics of the acoustic wave device being based on the one or more material properties.

* * * * *